United States Patent
Nishikawa

(10) Patent No.: US 6,353,327 B2
(45) Date of Patent: *Mar. 5, 2002

(54) CIRCUIT BOARD MISALIGNMENT DETECTION APPARATUS AND METHOD

(75) Inventor: Hideo Nishikawa, Uji (JP)

(73) Assignee: Nidec-Read Corporation, Kyoto (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/078,250

(22) Filed: May 13, 1998

(30) Foreign Application Priority Data

May 13, 1997 (JP) .............................. 9-121829

(51) Int. Cl.[7] .............................................. G01R 31/02
(52) U.S. Cl. ..................... 324/758; 324/158.1; 324/754
(58) Field of Search ................................. 324/758, 754, 324/755, 661, 662, 452, 457, 158.1, 130, 71.5, 537; 228/180.21, 180.22

(56) References Cited

U.S. PATENT DOCUMENTS

| | | | | |
|---|---|---|---|---|
| 4,158,171 A | * | 6/1979 | Abbe et al. .............. | 324/158 F |
| 4,386,459 A | * | 6/1983 | Boulin ........................ | 29/574 |
| 4,491,787 A | * | 1/1985 | Akiyama et al. .......... | 324/71.5 |
| 5,394,609 A | * | 3/1995 | Ferguson et al. .............. | 29/840 |
| 5,469,064 A | * | 11/1995 | Kerschner et al. .......... | 324/537 |
| 5,672,978 A | * | 9/1997 | Kimura ....................... | 324/754 |
| 6,051,983 A | * | 4/2000 | Watts ......................... | 324/754 |
| 6,066,957 A | * | 5/2000 | Van Loan et al. .......... | 324/758 |

FOREIGN PATENT DOCUMENTS

| | | | | |
|---|---|---|---|---|
| EP | 0859239 A2 | * | 8/1998 | ........... G01R/31/28 |
| JP | 53-47668 | | 12/1978 | |

* cited by examiner

Primary Examiner—Safet Metjahic
Assistant Examiner—Jimmy Nguyen
(74) Attorney, Agent, or Firm—McCormick, Paulding & Huber LLP

(57) ABSTRACT

Position detection electrodes are disposed so as to be point-symmetrical relative to an arbitrary point on a line X that extends almost along the center of a printed pattern on an opposite circuit board and is parallel with the Y axis. Position detector electrodes are disposed in the same manner. A probe selector switch section can provide a probe selection signal, and a position detector sensor selection which section can provide a signal for selecting among the position detection electrodes. A detected voltage varies depending on how the position detection electrode is opposed to a printed pattern. Thus, misalignment can be detected by detecting the opposition relationship between each of the position detection electrodes and the printed pattern.

8 Claims, 26 Drawing Sheets

MISALIGNMENT 0

MISALIGNMENT +

MISALIGNMENT −

S1 CONNECTION
S2 CONNECTION

MISALIGNMENT 0

MISALIGNMENT +

MISALIGNMENT −

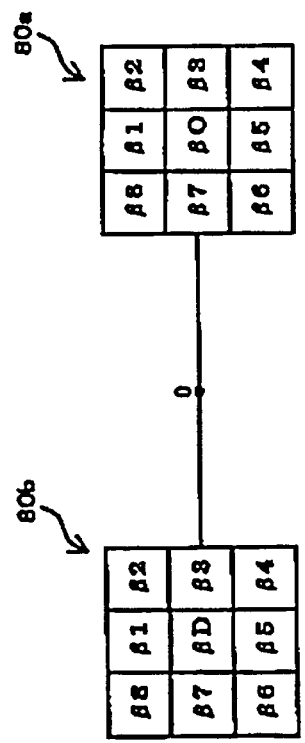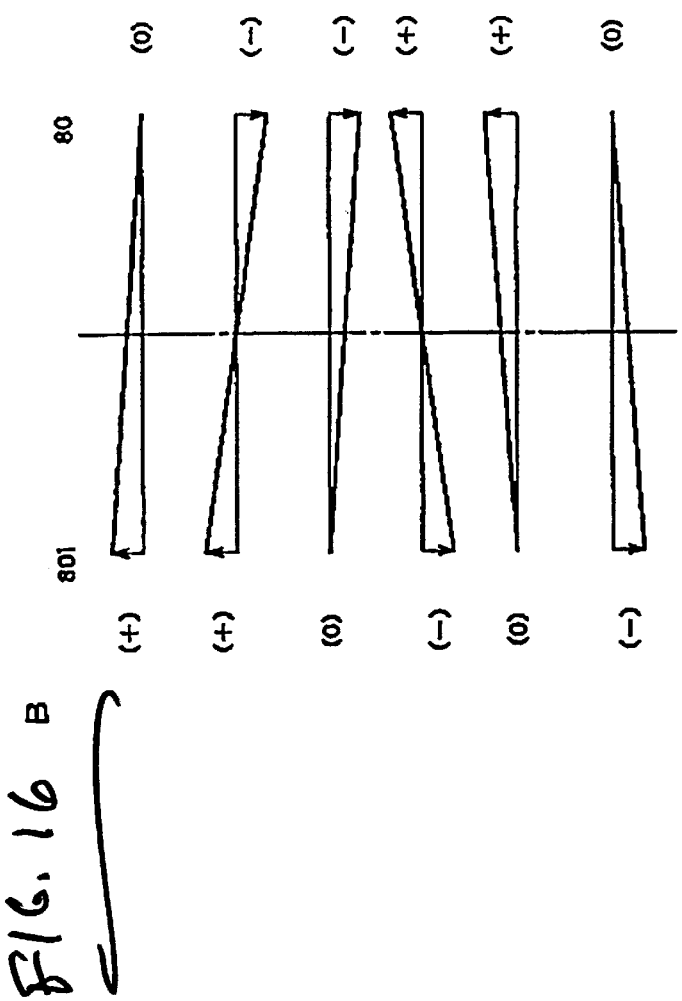
FIG. 16A
FIG. 16B

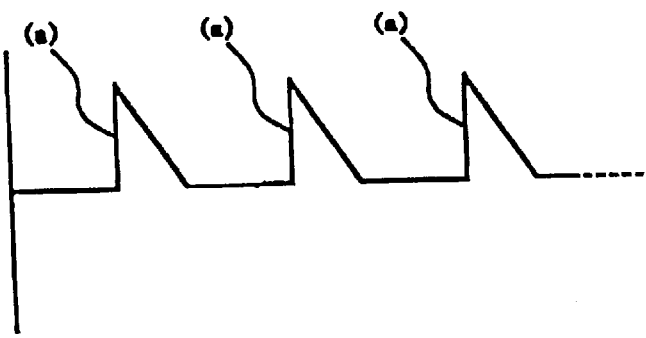
FIG. 22A SIGNAL SOURCE
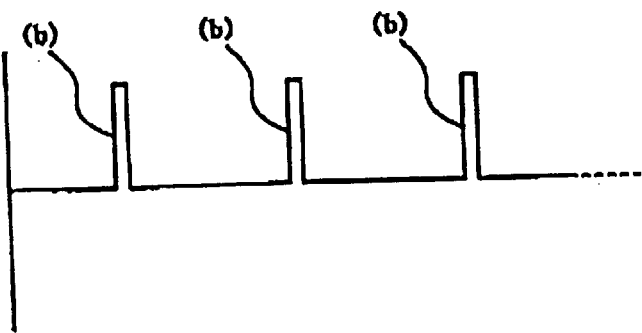
FIG. 22B SIGNAL SOURCE

CIRCUIT BOARD MISALIGNMENT DETECTION APPARATUS AND METHOD

FIELD OF INVENTION

The subject invention relates to a circuit board misalignment detection apparatus, and in particular, to a non-contact misalignment detection apparatus.

BACKGROUND OF THE INVENTION

The following methods for correcting misalignment between a circuit board and an inspection jig in a printed circuit board inspection apparatus are commonly known.

A first method is to photograph a reference point on the circuit board in order to detect misalignment (Japanese Patent Application Laid Open No. 1-184473, etc.) A second is to provide on an inspection jig a probe for detecting misalignment while forming a corresponding reference pattern on the circuit board (Japanese Patent Application Load Open NO. 6-51013).

These misalignment detection methods have the following problems. The first method requires an expensive camera and substantial time to install and remove the camera. In addition, a mark for the camera must be formed on the circuit board, and certain circuit boards do not allow such a mark to be provided near the position at which the camera is stopped.

The second method requires a special pattern on the circuit board for detecting misalignment. Furthermore, since a probe and the pattern must be electrically connected together, it is cumbersome to remove resists formed on the pattern.

It is a general object of the subject invention to provide a misalignment detection apparatus and method that solves the foregoing problems and can easily detect misalignment in a non-contact manner using a simple structure.

SUMMARY OF THE INVENTION

According to the circuit board misalignment detection apparatus of the present invention, misalignment is detected based on the variation in electrostatic capacity depending on the opposition condition between the wiring on an inspected circuit board and an electrode provided opposite the wiring. Thus, misalignment can be detected so long as the electrostatic capacity between the wiring and the electrode can be detected. That is, the apparatus does not require a camera or a special mark to be formed on the inspected circuit board, as in the prior art. Furthermore, common hardware can be used in an inspection apparatus for conducting continuity and short-circuit test based on electrostatic capacity.

More particularly, an electrostatic capacity detection means monitors variation in electrostatic capacity depending on the opposition condition between the electrode and the wiring, and a determination means reads the misalignment based on the detected electrostatic capacity. Thus, the apparatus neither requires a camera or a special mark on the inspected circuit board, as in the prior art. Furthermore, as above, common hardware can be used in the inspection apparatus for conducting a continuity and short-circuit test based on the electrostatic capacity.

Further, the circuit board misalignment detection apparatus has first and second X-direction electrodes for detecting misalignment in the X direction. It also has first and second Y-direction electrodes for detecting misalignment in the Y direction. Thus, the direction of misalignment can be detected to allow prompt correction.

Still further, first and second x-direction electrodes are disposed so as to be point-symmetrical relative to an arbitrary point on a line that extends approximately along the center of the wiring on the opposite circuit board and is parallel with the Y axis. The first and second Y-direction electrodes are disposed so as to be point-symmetrical relative to an arbitrary point on a line that extends approximately along the center of the wiring on the opposite circuit board and is parallel with the X axis. Thus, misalignment can be reliably detected in both the X and Y directions.

Still further, the first and second X-direction electrodes partly protrude from the wiring of the opposite circuit board even if there is no misalignment in the X direction. Similarly, the first and second Y-direction electrodes partly protrude from the wiring of the opposite circuit board even if there is no misalignment in the Y direction. Thus, misalignment can be detected even if the wiring for which misalignment is to be detected is of minimal cross section.

Still further, the apparatus preferably has two sets of X- and Y-direction electrodes, and the determination means reads the misalignment in the $\theta$ direction based on the electrostatic capacity detected by the two sets of electrodes. Thus, misalignment can be detected in not only the X and Y directions, but also in the $\Theta$ direction.

Finally, the method for detecting misalignment between an inspected circuit board and a circuit board inspection apparatus, detects misalignment based on the variation in electrostatic capacity depending on the opposition condition between wiring on an inspected circuit board and an electrode provided opposite condition between wiring on an inspected circuit board and an electrode provided opposite to the wiring. Thus, misalignment can be detected as long as the electrostatic capacity between the wiring the electrode can be detected. That is, apparatus employing the method does not require the use of a camera or and as stated, a special mark on the inspected circuit board, as in the prior art. Furthermore and as stated, common hardware can be used for an inspection apparatus conducting a continuity and short-circuit test based on electrostatic capacity.

DESCRIPTION OF PREFERRED EMBODIMENTS

Figure 1:
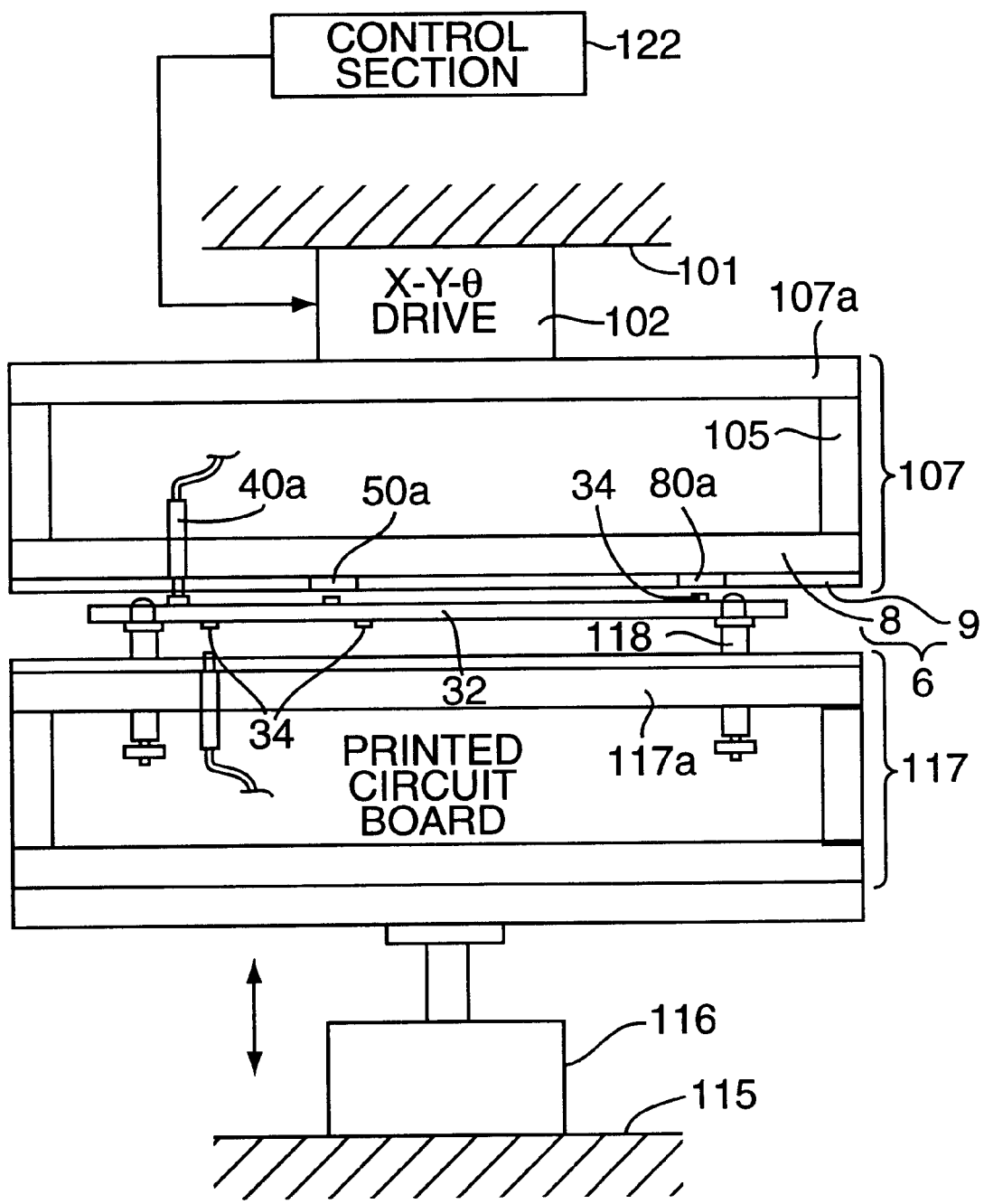
FIG. 1 is a schematic drawing of an entire bare board tester according to the subject invention.

FIG. 1 shows a bare board tester indicated generally at 1 comprising circuit board inspection apparatus with a misalignment correction mechanism according to one embodiment of the invention. The bare board tester 1 is an apparatus which inspects the continuity of a printed pattern on a printed circuit board (a bare board) on which circuit elements have not yet been mounted.

The bare board tester 1 comprises an upper fixed base 101, an X-Y-Θ drive device 102, an upper jig 107, a lower fixed base 115, a press or vertical drive mechanism 116, a lower jig 117, and a control section 122.

The lower jig 117 is provided on the lower fixed base 115 via the press 116. An inspected circuit board 32 is placed on the lower inspection jig 117 via four posts 118.

Figure 3:
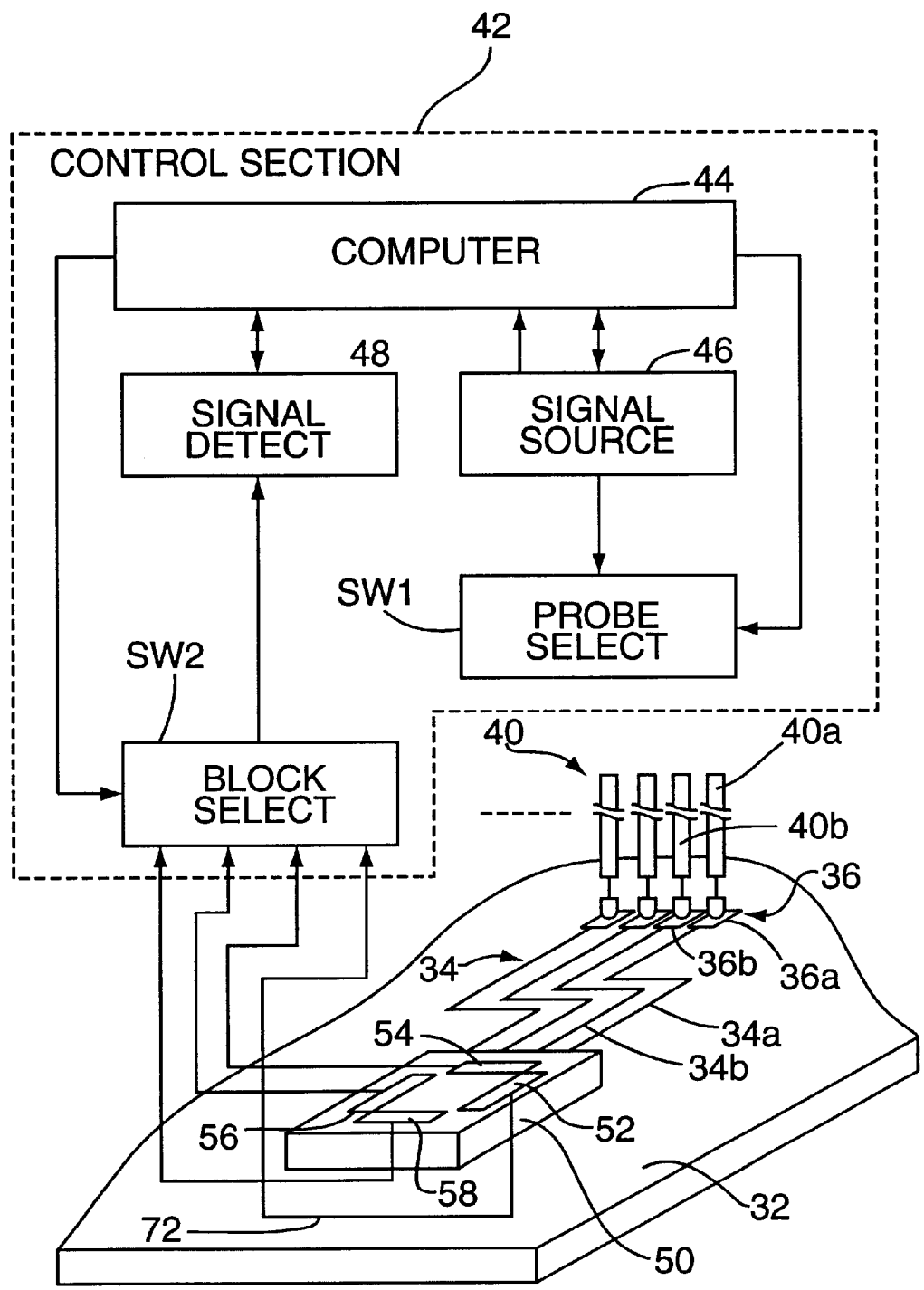
FIG. 3 shows the configuration of the continuity tester section of the bare board tester.

The circuit board 32 has a plurality of printed patterns 34a, 34b, . . . in the form of wiring as shown in FIG. 3. The plurality of printed patterns 34a, 34b, . . . are collectively referred to as a printed pattern section 34. Pads 36a, 36b, . . . are collectively referred to as a pad section 36.

Figure 4:
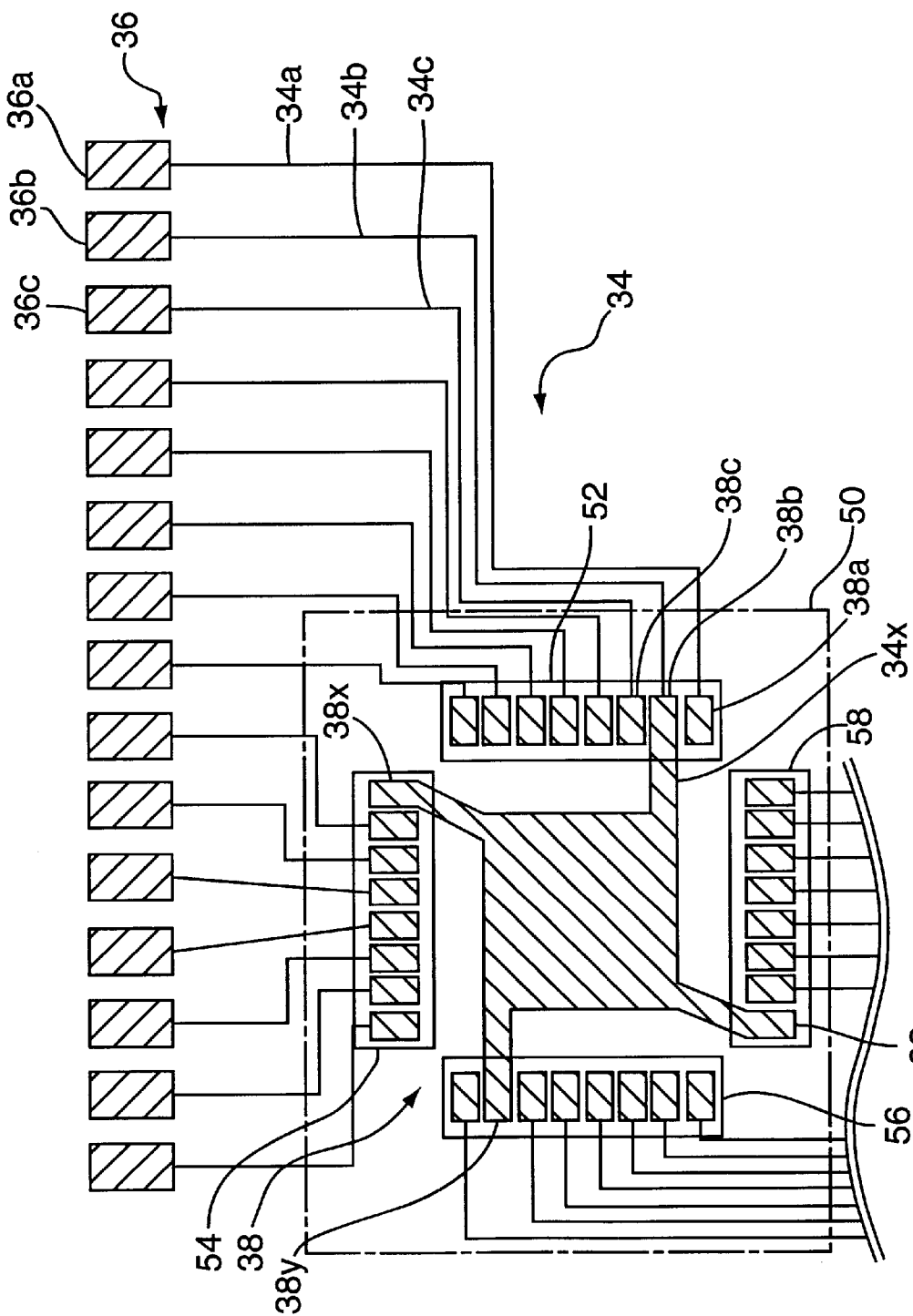
FIG. 4 shows a printed pattern section on an inspected circuit board in detail.

FIG. 4 shows the details of the printed pattern section 34. Pads 38a, 38b, . . . are formed at the other end of the printed patterns 34a, 35b, . . . , respectively. The pads 38a, 38b, . . . are collectively referred to as a pad section 38. The pad section 38 is referred to as a "QFP" pattern, on which a QFP (Quad Flat Package) is mounted. Thus, the pitch at which the pads 38a, 38b, . . . are arranged in very small. In addition, the QFP pattern, the pad 38b is connected to the pads 38x, 38y, and 38z by the printed pattern 34x to form a ground line.

The printed pattern section 34 is covered with resists (not shown).

Reverting to FIG. 1, a head base 107a of the upper jig 107 is mounted on the bottom surface of the upper fixed base 101 via the X-Y-Θ drive device 102. A probe holding plate 2105 is mounting on the bottom surface of the head base 107a in such a way that a gap is provided between the probe holding plate 105 and the head base 107a by a strut 105. The probe holding plate 106 has a base plate 108 and a guide plate 109 provided on the bottom surface of the base plate. The base plate 108 holds a plurality of probes, 40a, 10b, . . . The probes 40a, 40b, . . . are collectively called a "probe section" 40. The guide plate 109 accurately maintains the position of the probe section 40. The guide plate 109 includes a continuity sensor module 50a and a misalignment sensor module 80a.

Figure 2:
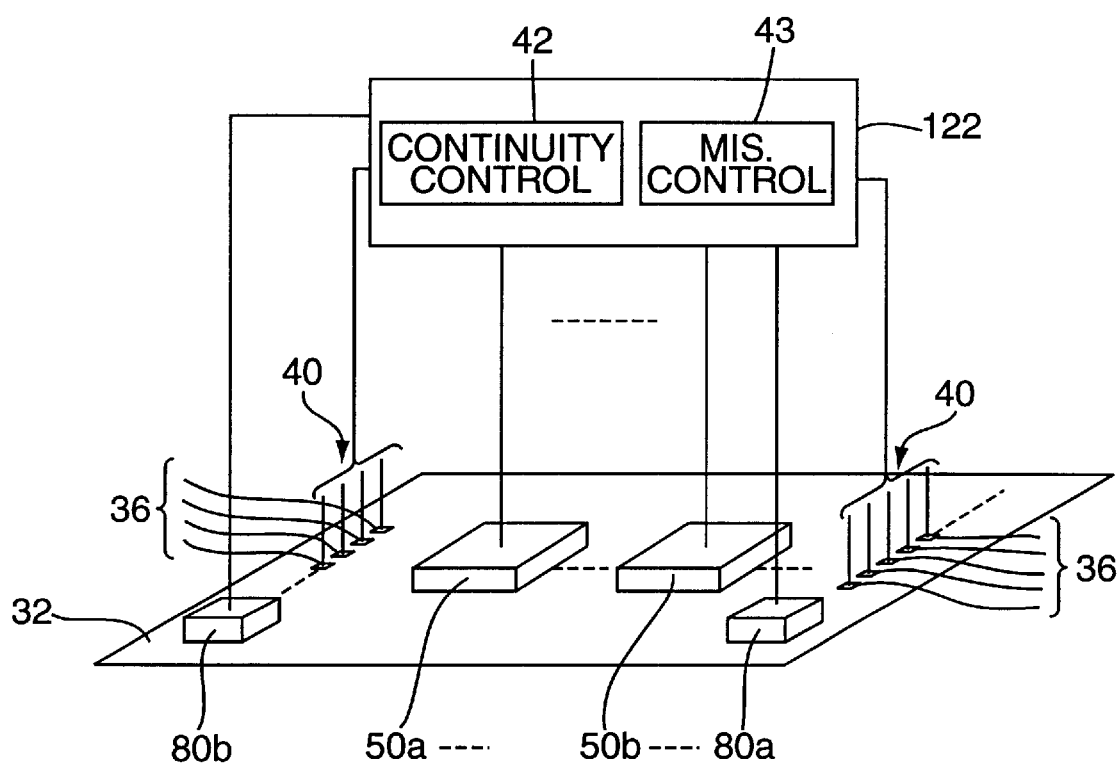
FIG. 2 illustrates the relationship between a control section and continuity sensor modules, misalignment sensor units, a probe and a circuit board.

The relationship between the continuity sensor module 50a, misalignment sensor module 80a, probe 40, and control section 122 will now be described with reference to FIG. 2.

The probes 40a, 40b, . . . are electrically connected to the pads 36a, 36b, . . . on the circuit board 32. The control section 122 has a continuity control section 42 and a misalignment control section 43. Two misalignment sensor modules 80a and 80b, a plurality of continuity sensor modules 50a, 50b, . . . , and the probe section 40 are connected to the control section 122.

Continuity Test Mechanism

Figure 7A:
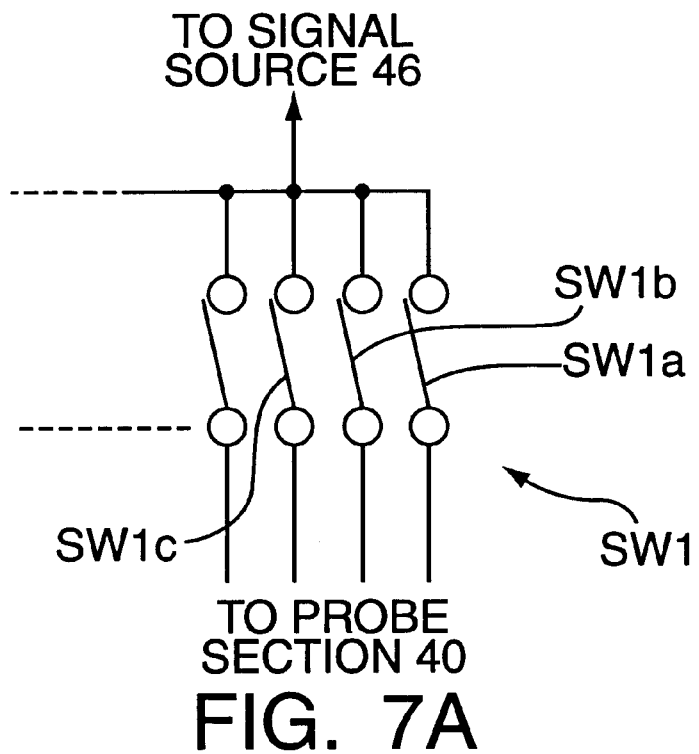
FIG. 7A schematically shows a probe selection switch section.

The function of the continuity tester section of the bare board tester 1 is best described with reference to FIG. 3. A signal generated by a signal source 46 for inspection is provided to a probe selection switch section SW1 that constitutes a first switch means. FIG. 7A schematically shows the probe selection switch section SW1. The probe selection switch section SW1 comprises a plurality of switches SW1a, SW1b . . . Each switch is activated and deactivated by computer 44 shown in FIG. 3, and transfers a signal provided by the signal source 46 to a desired probe in the probe section 40, for example, the probe 40a (in this case, only the switch SW1a is activated).

The signal transferred to the probe 40a is provided to the pad 38a (see FIG. 4) of the pad section 38 via the pad 36a of the pad section 36 connected to the probe 40a and via the printed pattern 34a in the printed pattern section 34.

As shown in FIG. 4, the continuity sensor module 50 is disposed on the pad section 38 of the circuit board 32. The continuity sensor module 50 is capacitively connected to the pad section 38 to obtain a signal from the pad section 38 in order to provide it to a block selection switch section SW2 which constitutes a second switch means, as described below.

As shown in FIG. 4, the continuity sensor module 50 comprises four continuity sensor units 52, 54, 56, and 58.

Each continuity sensor unit corresponds to a second terminal. The continuity sensor module 50 according to this embodiment is composed of a circuit board 60 (see FIG. 6B) manufactured using a process similar to that for the inspected circuit board 32.

Figure 6A:
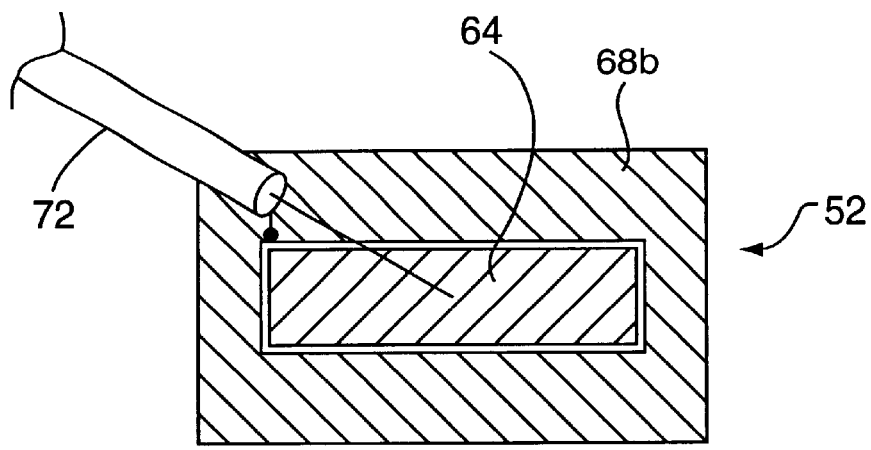
FIG. 6A is a plan view schematically illustrating a continuity sensor unit.
Figure 6B:
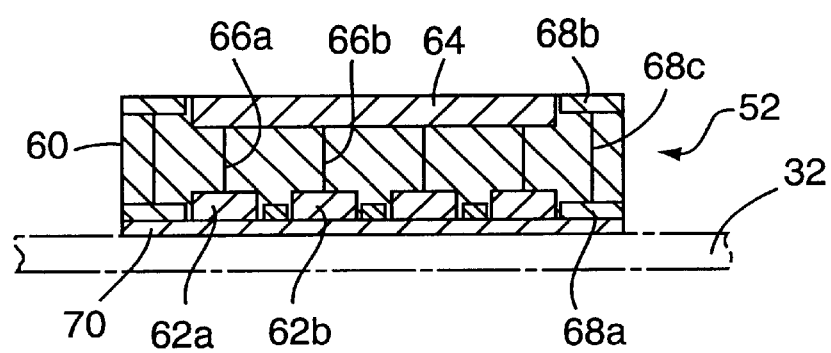
FIG. 6B is a cross-sectional view schematically illustrating the integral part of the continuity sensor unit of FIG. 5A.
Figure 6C:
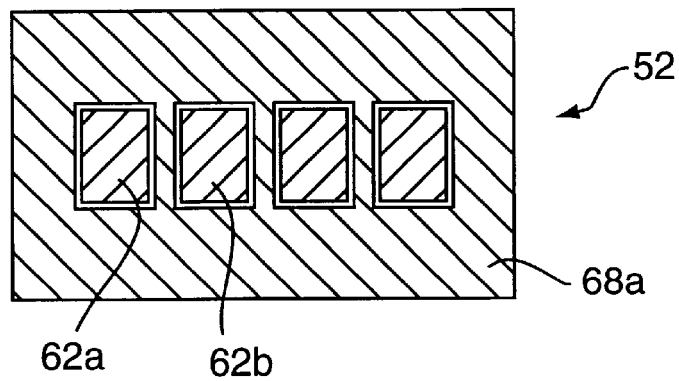
FIG. 6C is a bottom view schematically illustrating the continuity sensor unit.

The continuity sensor unit 52 constituting part of the continuity sensor module 50 is described with reference to FIGS. 6A, 6B, and 6C. FIG. 6A is a plan view of the sensor unit 52, FIG. 6B is a cross-sectional view of the integral portion of the unit, and FIG. 6C is a bottom view. As shown in FIGS. 6B and 6C, electrode plates 62*a*, 62*b*, constituting an electrode section, are independently provided on the bottom surface of the circuit board 60. An insulating film 70 is formed to cover the electrode plates 62*a*, 62*b*, . . . FIG. 6C omits the insulating film.

The electrode plates 62*a*, 62*b*, . . . are positioned to be opposed to those pads 38*a*, 38*b*, . . . (see FIG. 4) of the pad section 38 on the inspected circuit board 32 which are disposed to correspond to the continuity sensor unit 52 in such a way as to form a group and the electrode plate 62*a* of the continuity sensor unit 52, the insulating film 70, and the pad 38*a* of the inspected circuit board 32 form a capacitor. This is also applicable to the other electrodes 62*b*, etc.

The continuity sensor unit 52 has eight electrode plates 62*a*, 62*b*, corresponding to the eight pads 38*a*, 38*b*, . . . (the eight pads form a group), but only four are shown in FIGS. 6A, 6B, and 6C.

A connection plate 64 that is a conductive connection section is provided on the top surface of the circuit board 60, as shown in FIGS. 6B and 6A. The connection plate 64 is electrically connected to the electrode plates 62*a*, 62*b*, . . . via through—holes 66*a*, 66*b*, . . . . Thus, the connection plate 64 of the continuity sensor unit 52 is capacitively coupled to the group of pads 38*a*, 38*b*, . . . The connection plate 64 is connected to the block selection switch section SW2 via a connection cord 72, as shown in FIG. 6A. The connection plate 64 and the through-holes 66*a*, 66*b*, . . . correspond to a connection means.

In addition, shield films or members 68*a* and 68*b* are formed on the bottom and top surfaces of the circuit board 60, respectively, and are connected together via a through-hole 68*c*, as shown in FIGS. 6A, 6B, and 6C. The shield films 68*a* and 68*b* are provided with ground potential.

Figure 5A:
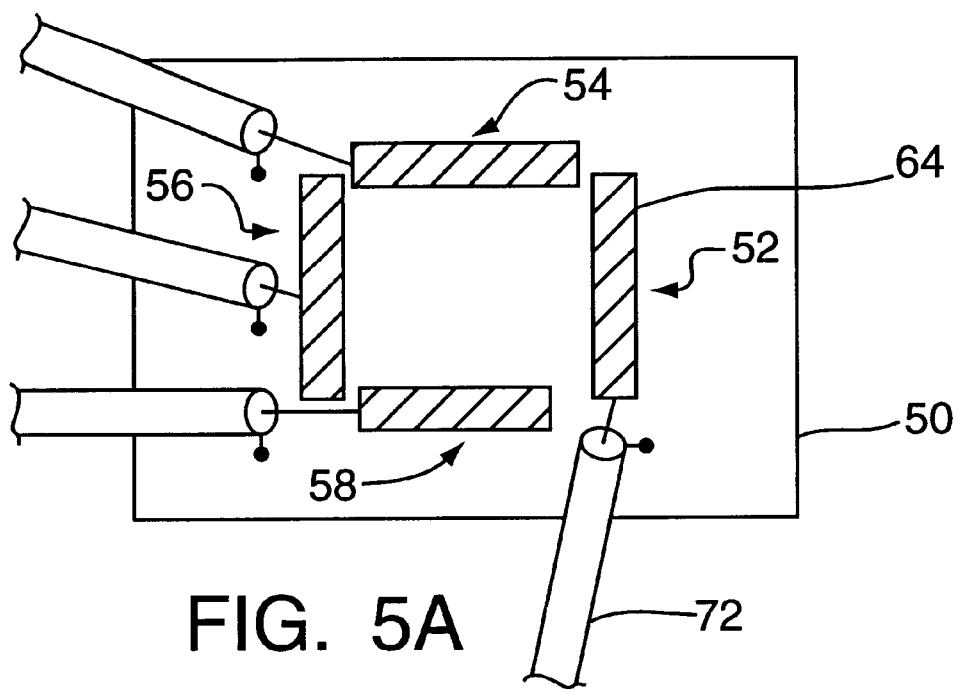
FIG. 5A is a plan view of a continuity sensor module.
Figure 5B:
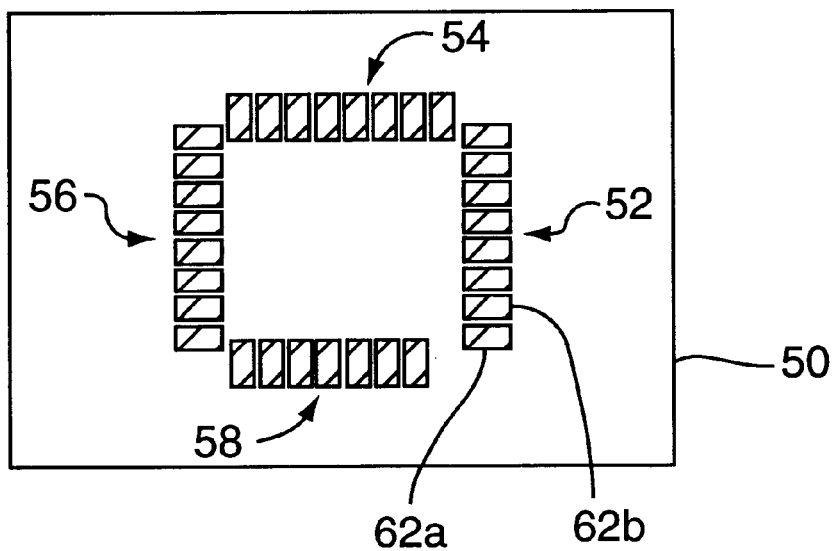
FIG. 5B is a perspective view of the bottom surface of the continuity sensor module of FIG. 5A as seen from above.

Continuity sensor units 54, 56, and 58 (see FIG. 2) constituting the other part of the continuity sensor module 50 have a similar configuration to the continuity sensor module 62. FIG. 5A shows a plan view of the continuity sensor module 50. FIG. 5B is a perspective view in which the bottom surface of the continuity sensor module 50 is seen from above.

Figure 7B:
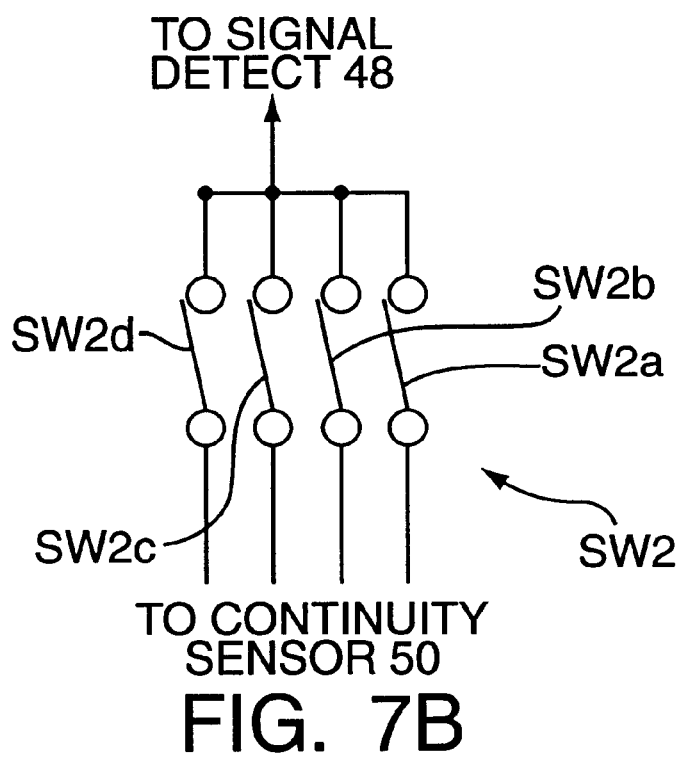
FIG. 7B schematically shows a block selection switch section.

FIG. 7B schematically shows the block selection switch section SW2. The block selection switch section S@2 comprises four switches SW2*a* SW2*b*, SW2*c*, and SW2*d*. Each switch is activated and deactivated by an instruction from the computer 44 (see FIG. 3), and provides the signal detection section 48 a signal from one of the four continuity sensor units 52, 54, 56, and 58 constituting the continuity sensor module 50. For example continuity sensor unit 52 (in this case, only the switch SW2*a* is activated).

A signal provided by the continuity sensor unit 52 is subjected a predetermined process by the detection section 48 shown in FIG. 3 and then delivered to the computer 44. Based on the delivered signal, the computer 44 determines the continuity of the printed pattern (in the above example, the printed pattern 34*a*) selected by the probe and block selection switch sections SW1 and SW2. The computer 44, signal source 45, and signal detection section 48 constitute the continuity control section 42.

Thus, since the continuity sensor module 50 is composed of the continuity sensor units 52, 54, 56 and 58 and a signal is independently obtained from each continuity sensor unit, the following effects can be obtained.

As described above, in the pad section 38 (the QFP) pattern) in the printed pattern selection 34 shown in FIG. 4, the pads 38*b* and pattern 38*x*, 38*y*, and 38*z* are connected together by the printed pattern 34*x* to form a ground line. Thus, by using the probe selection switch section SW1 to select the pad 36*b* and using the block selection switch section SW2 to select the continuity sensor unit 54 to inspect continuity, it can be determined whether or not the printed pattern 34*x* is open-circuited between the pads 38*b* and 38*x*.

Since the sensor module is composed of the plurality of sensor units and a signal is independently obtained from each continuity sensor unit, the continuity of complicated or irregularly printed patterns can be inspected accurately.

Figure 8:
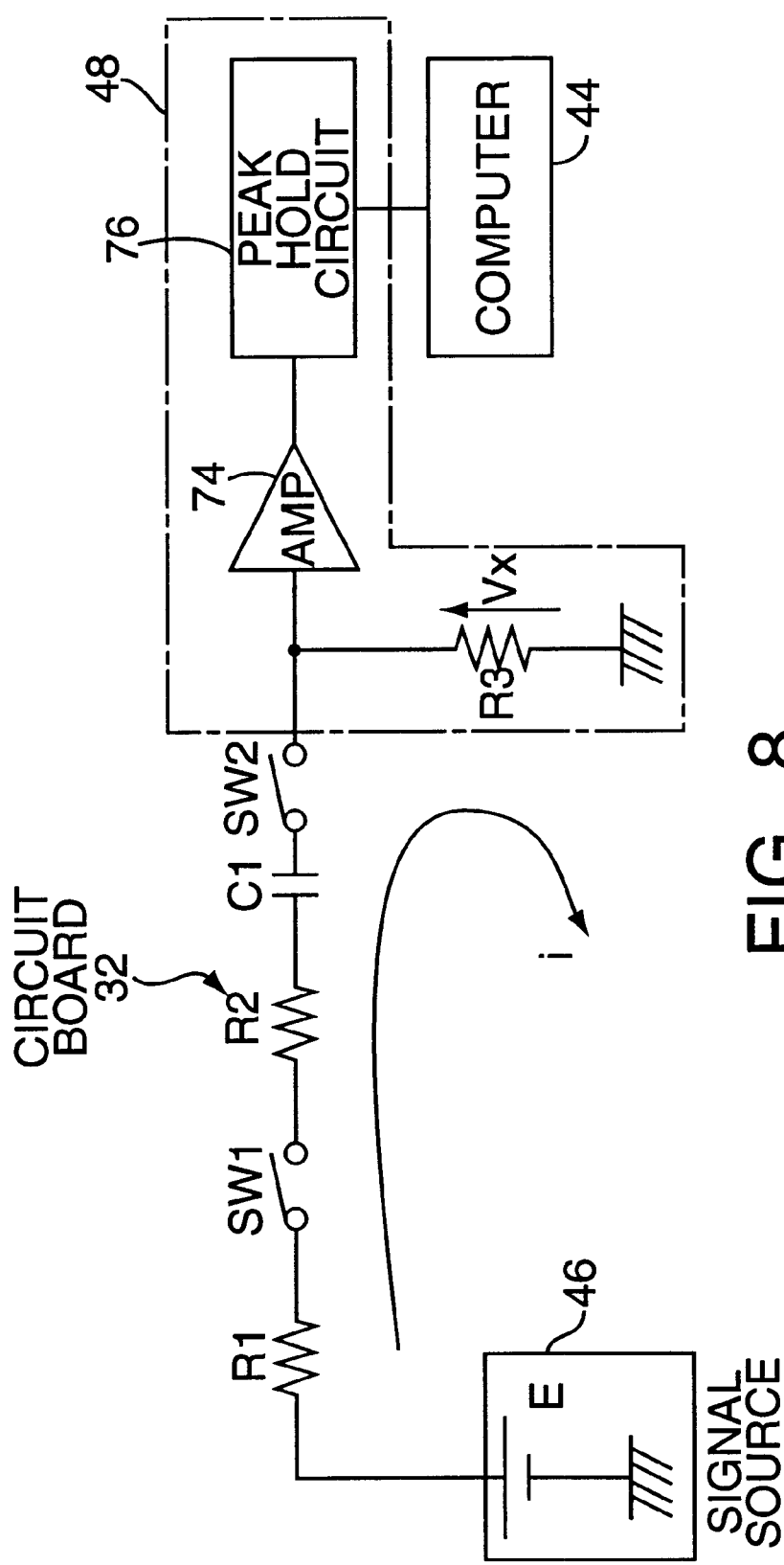
FIG. 8 illustrates signal processing.
Figure 9:
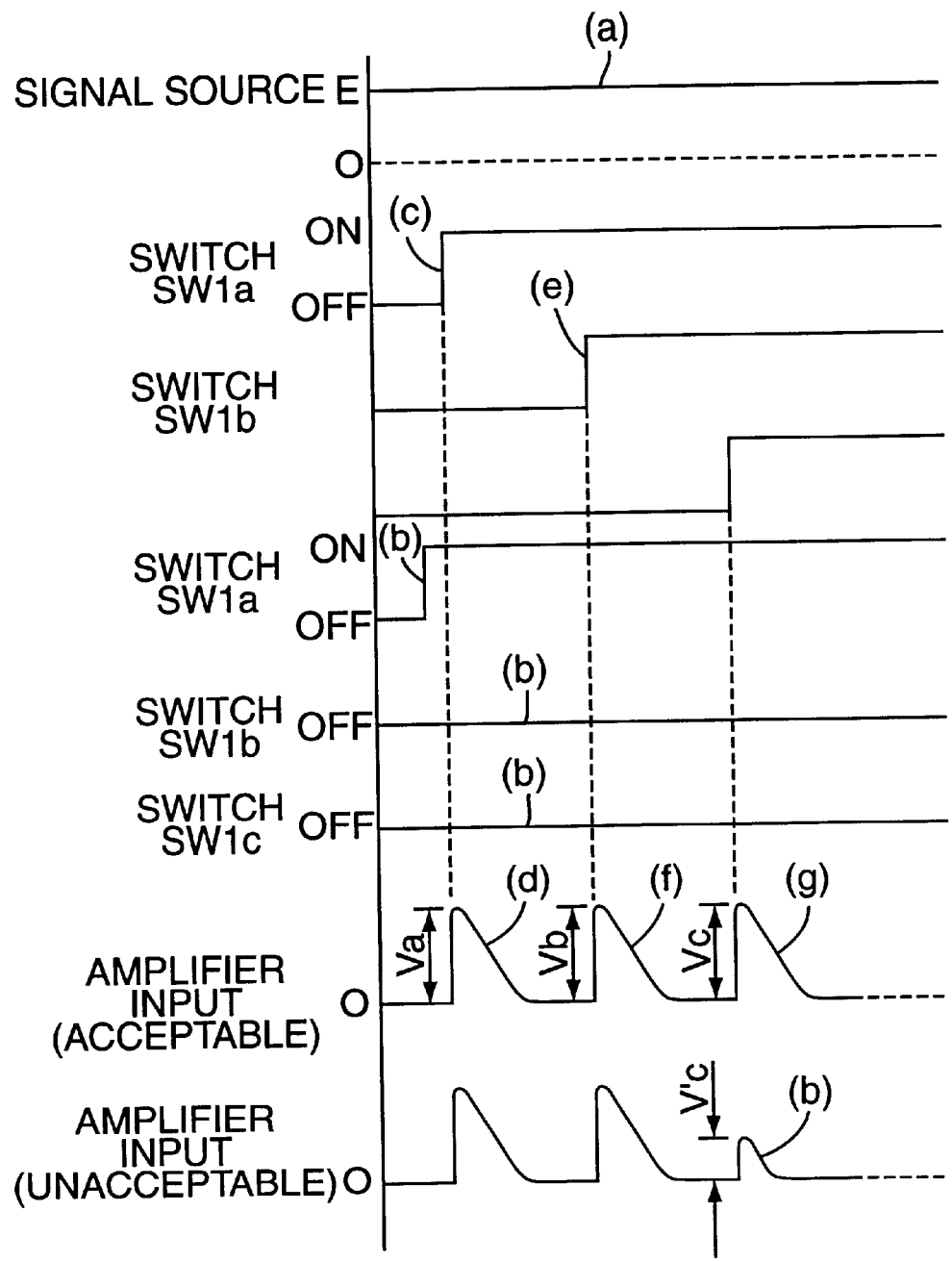
FIG. 9 is a timing chart for signal processing.

In addition, according to the subject invention, the signal detection section 48 carries out signal processing as follows. FIG. 8 shows an equivalent circuit for signal processing. FIG. 9 is a timing chart for signal processing. FIG. 9 omits part of the switches of the probe and block selection switch sections SW1 and SW2.

This embodiment uses a source of a constant voltage as the signal source 46 (see FIG. 9(*a*)). Thus, a constant voltage E is provided to the probe selection switch section SW1 shown in FIG. 3 by the signal source 46. The computer 44 first transmits an instruction to the block selection switch section SW2 to activate only the switch SW2*a* while leaving the other switches SW2*b*, SW2*c*, and SW2*d* deactivated (see FIG. 7(B) and 9(*b*)). This allows only the continuity sensor unit 52 to be connected to he signal detection section 48 while the other continuity sensor units 54, 56, and 58 remain disconnected from the signal detection section 48.

The computer 44 then transmits an instruction to the probe selection switch section SW1 to activate only the switch SW1*a* (FIG. 98(*c*)) while leaving the other switches SW1*b*, SW1*c*, . . . deactivated (see FIGS. 7A). This allows only the probe 40*a* to be connected to the signal source 46 while the other probes 40*b*, 40*c* . . . remain disconnected from the signal source 46. Thus, allows the printed pattern 34*a* on the circuit board 32 is selected for inspection.

In FIG. 8, a resistor R1 represents the internal resistance of the switches SW1*a* and SW2*a* and a resistor R2 represents the resistance of the printed pattern 34*a* on the circuit board 32. A resistor R3 represents the ground resistance in the signal detection section 48. In addition, a capacitor C is formed of the electrode plates 62*a*, 62*b*, . . . of the continuity sensor unit 52, the insulating film 70 (see FIG. 8(B)), and the pads 38*a*, 38*b*, . . . corresponding to the continuity sensor unit 52 (see FIG. 4). E represents a DC voltage from the signal source 46.

When the switch SW1*a* is activated (see FIG. 9(*c*)), the equivalent circuit shown in FIG. 87 is closed to cause a current (i) to flow because the switch SW1*a* has been is activated.

$$i = E/(R1+R2+R3) \cdot \exp(-\alpha t) \quad (1)$$

$$(\alpha = 1/\{R1+R2+R3) \cdot C1\}$$

An input voltage Vx to the amplifier 74 is shown below.

$$Vx = R3 \cdot i \quad (2)$$
$$= R3/(R1 \text{ \& } R2 + R3) \cdot E \cdot \exp(-\alpha t)$$
$$(\alpha = 1/\{(R1 + R2 + R3) \cdot C1\})$$

After the voltage Vx has been amplified by the amplifier 74, its maximum value (corresponding to the voltage Va in FIG. 9(d)) is detected and held by a peak hold circuit 76. The peak hold circuit 76 includes a D/A converter (not shown) to digitize the maximum value before transmitting it to the computer 44.

Part of the function of the peak hold circuit 76 can of course be implemented by the computer 44.

Based on the maximum value, the computer 44 determines the continuity of the printed pattern 34a on the circuit board 32. For example, the computer 44 makes this determination depending on whether or not the maximum value is between lower and upper reference values which have been preset As shown in Equation (2), the input voltage Vx to the amplifier 74 exhibits the maximum voltage Va (=R3/(R1+R2+R3)·3) at the same time the switch SW1a is activated (see FIG. 9(d)).

Thus, detection processing of the maximum value by the peak hold circuit 76 can be finished in a short time. Consequently, the subject invention is unlikely to be subjected to a humming noise.

The computer 44 then transmits an instruction to the probe selection switch section SW1 to activate the switch SW1b (see FIG. 9(e)). The switch SW1a remains activated. This causes the probes 40a and 40b to be connected to the signal source 46. In this case, the condition of the block selection switch section SW2 remains unchanged.

As described above, the input voltage Vx to the amplifier 74 exhibits the maximum value Vb (see FIG. 9(f) almost at the same time the switch SW1b is activated (FIG. 9(e)). The computer 44 determines the continuity of the printed pattern 34b on the circuit board 32 based on the maximum value Vb, as described above.

The printed pattern 34a on the circuit board 32 is selected together with the printed pattern 34b, but the capacitor C1 on the equivalent circuit (see FIG. 8) formed of the printed pattern 34a is almost fully charged when the switch SW1b is activated (the timing with which the switch SW1b is activated is set so as to meet this condition). Thus, little current (i) flows through the printed pattern 34b.

According to the subject invention, the continuity sensor module 50 is composed of the plurality of continuity sensor units 52, 53, . . . (see FIG. 4), and each continuity sensor unit is coupled to each group of pads corresponding to the unit through the respective independent capacitor. Thus, the electrostatic capacity of the individual capacitor C1 is relatively small. That is, ($\alpha$) shown in Equation (1) has a relatively large value (the time constant is small). Consequently, the time (t) until the current (i)=0 is short, as is apparent from Equation (1). Therefore, this embodiment enables the continuity of the printed pattern to be determined in a short cycle.

The computer 44 inspects the continuity of the printed patterns 34c, . . . using a similar procedure by switching each switch of the probe and block selection switch sections SW1 and SW2 as required. If the circuit board 32 is acceptable, that is, if the printed patterns 34a, 34b, and 34c . . . are not open-circuited, the input voltage Vx to the amplifier 74 is as shown at (d), (f), (g), . . . , as shown in FIG. 9.

On the other hand, if the circuit board 32 is unacceptable, for example, if the printed pattern 34c is open-circuited, the input voltage Vx to the amplifier 74 is as shown at (h) and the maximum value Vc is so small that the open circuit can be easily determined. This is also apparent from Equation (2) wherein Vx=0 regardless of the time (t) if R2, representing the resistance of the printed pattern, is infinite (completely open-circuited).

As a result, the continuity of the printed patter can be inspected promptly and accurately Next, the function of the misalignment inspection section of the bare board tester 1 will be described with reference to FIG. 10. Misalignment sensor unit 80a comprises position detection electrodes S1 to S4. The misalignment control section 43 comprises the computer 44, the signal detection section 48, the signal source 46, a probe selection switch section SW11, and a position detection sensor selection switch section 48 are shared by the continuity inspection mechanism shown in FIG. 3.

According to this embodiment, the position detection electrode S1 corresponds to a first X-direction electrode and the position detection electrode S2 corresponds to a second X-direction electrode. That is, the position detection electrodes S1 and S2 correspond to the X-direction electrodes. The position detection electrode S3 corresponds to a first Y-direction electrode and the position detection electrode S4 corresponds to a second Y-direction electrode. Thus, the position detection electrodes S3, S4 correspond to the Y-direction electrodes.

If the inspected circuit board is accurately placed on the bare board tester 1, the misalignment sensor unit 80a is fixed to the guide plate 109 of the upper jig 107 in such a way that the position detection electrodes S1 to S4 are disposed to correspond to the pattern on the circuit board. The position detection electrodes S1 and S2 are disposed so as to be point-symmetrical relative to an arbitrary point pct on a line Lax that extends almost along the center of the printed pattern 34a on the opposite circuit board and that is parallel with the Y axis, as shown in FIG. 10. Moreover, the position detection electrodes S1 and S2 partly protrude outwardly from the printed pattern 34a even if there is no misalignment in the X direction. The position detection electrodes S3, S4 are also disposed so as to be point-symmetrical relative to an arbitrary point py on a line Ly that extends almost along the center of the printed pattern 34a on the opposite circuit board and that is parallel with the X axis. Moreover, the position detection electrodes S3, S4 partly protrude outward from the printed pattern 34a even if there is no misalignment in the Y direction. The printed pattern 34a is covered with the resist 39. The position detection electrodes S1 to S4 are disposed over the printed pattern 34a so as to maintain a gap (t) between the electrodes and the printed pattern 34a (see FIG. 11). The probe 40a contacts the pad 36a.

The computer 44 provides a signal to the probe selection switch section SW to select one of the probes. The computer 44 provides a signal to the position detection sensor selection switch section to select one of the position detection electrodes S1 to S4.

Figure 12:
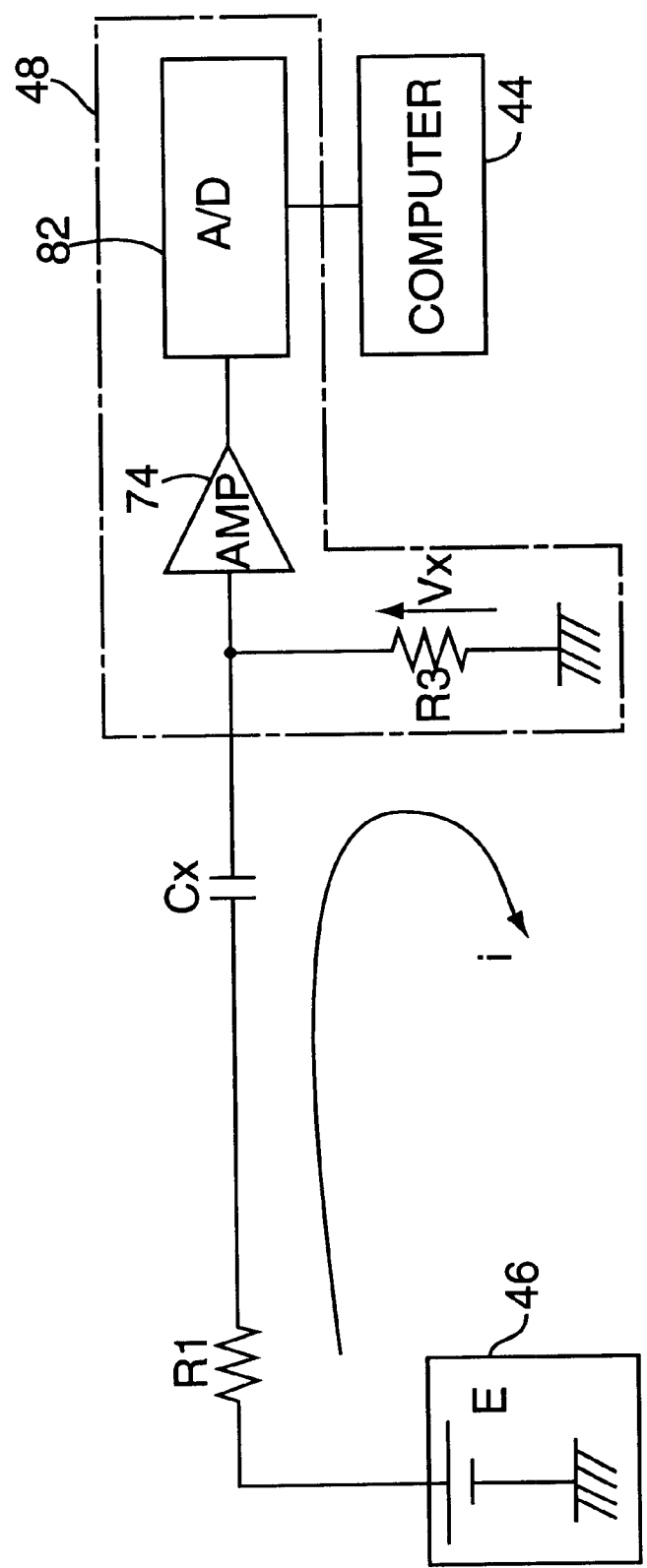
FIG. 12 shows an equivalent circuit for detecting misalignment.
Figure 13A:
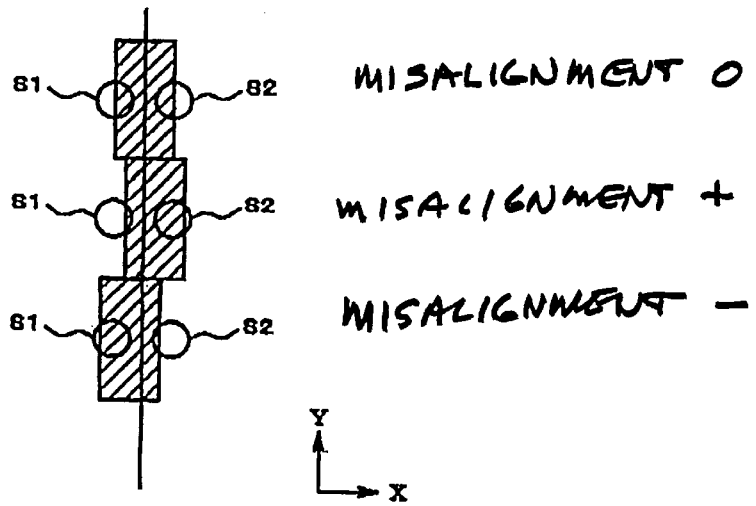
FIG. 13 shows the movement of signal wave forms obtained if there is misalignment.
Figure 13B:
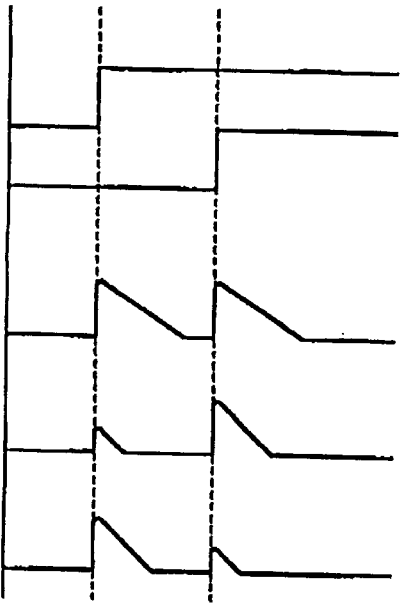

FIG. 12 shows an equivalent circuit if the position detection electrode S1 is selected. The electrostatic capacity of the capacitor Cx shown in FIG. 12 varies depending on the opposition areas between the position detection electrode S1 and the printed pattern 34a. The voltage detected by the amplifier 74 varies with the electrostatic capacity of the capacitor CX, and this variation is converted into digital data by the A/D converter 82 and then sent to the computer 44. Thus, the opposition relationship between the position detection electrode S1 and the printed pattern 34a can be detected. By detecting the opposition relationship between the position detection electrode S2 and the printed pattern 34a, misalignment can also be detected. That is, if there is no misalignment in the X direction (see FIG. 13A), the peak voltages measured by the position detection electrodes S1 and S2 will be equal (See FIG. 13B). On the other hand, if there is misalignment in the positive direction (see FIG. 13A), then the opposition area of the position detection electrode S2 increases compared to the position detection electrode 1. Thus, the peak voltage detected by the position detection electrode S2 becomes larger than the peak voltage detected by the position detection electrode S1 (see FIG. 13B). On the contrary, if there is misalignment in the negative X direction, then the opposition area of the position detection electrode S1 increases compared to the position detection electrode S2, thereby increasing the peak voltage detected by the position detection electrode S1 beyond the peak voltage detected by the position detection electrode S2. In this manner, by measuring the variation of the electrostatic capacity caused by the difference in opposition area, the position detection electrodes S1 and S2 can be disposed at an equal distance from the center of the printed pattern 34a.

In this case, only the direction of misalignment can be determined but the absolute amount of misalignment cannot be detected. Thus, this embodiment corrects the misalignment in the X, Y, and Θ directions as follows.

First, the computer 44 determines if there is a circuit board (step ST3). If so, it conducts a continuity and short-circuit test (step ST5). The continuity and short-circuit test has already been described and is therefore omitted here.

Then, the computer 44 determines whether there is any problem in the continuity and short-circuit conditions of all wiring patterns (step ST7). If not, it outputs "OK" as the result of the inspection (step ST9).

Figure 15:
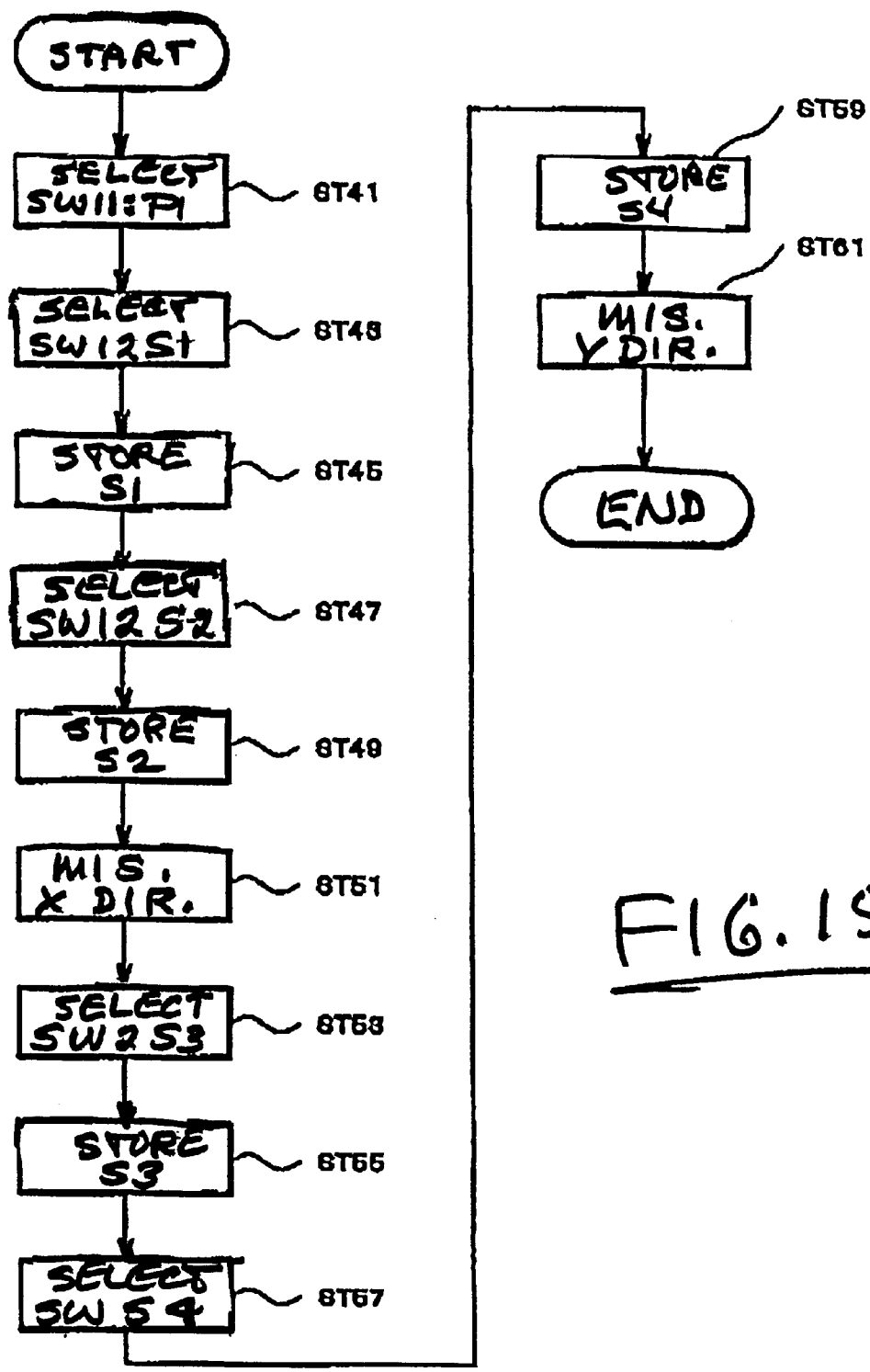
FIG. 15 is a flow chart for the detection of misalignment.

On the other hand, if any problem is found at step ST7, the computer carries out misalignment detection. This detection is explained with reference to FIG. 15. The computer 44 selects P1 for the probe selection switch section SW11 (step ST41), selects the position detection electrode S1 for the position detection sensor selection switch section SW12 (step ST43), and stores the output from the position detection sensor S1 (step ST45). The computer 44 then selects the position detection electrode S2 for the position detection sensor selection switch section SW12 (step ST47) and stores the output from the position detection sensor S2 (step ST 49). It determines the direction of misalignment in the X direction from the results of the output from the position detection electrodes S1 and S2 (step ST51). Similarly, to detect the direction of misalignment in the Y direction, the computer 44 selects the position detection electrode S3 for the position detection sensor selection switch section SW12 (step ST53) and stores the output from the position detection electrode S3 (step ST55). The computer 44 then selects the position detection electrode S4 for the position detection sensor selection switch section SW2 (step ST57) and stores the output from the position detection electrode S4 (step ST 59). It determines the direction of misalignment in the Y direction from the results of the output from the position detection electrodes S3, S4 (step ST61). Thus, the direction of misalignment in both the X and Y directions are obtained for the misalignment sensor unit 80a. Likewise, the direction of misalignment in both the X and Y directions is determined for the misalignment sensor unit 80B.

Figure 14:
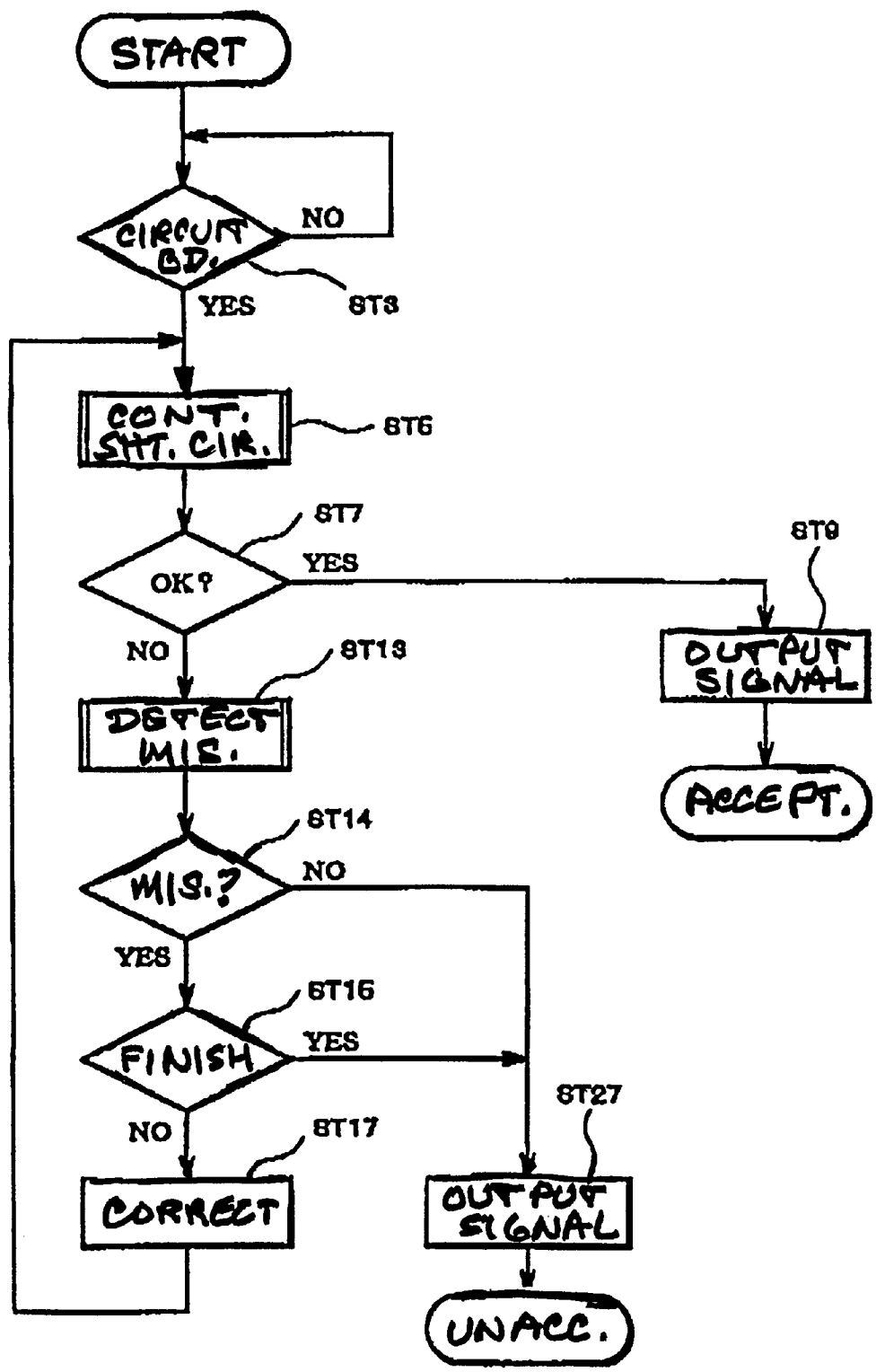
FIG. 14 is a flow chart for the entire bare board tester.
Figure 16A:
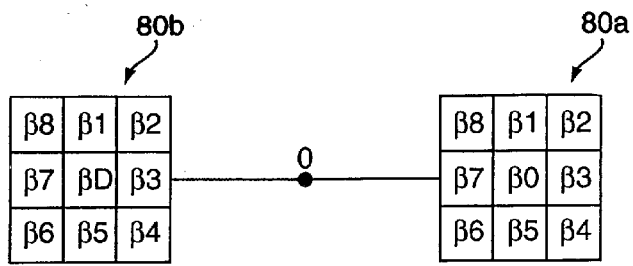
FIG. 16 illustrates misalignment in the Θ direction.

Next, the computer 44 determines whether or not there is a misalignment (step ST14). This is executed as follows. As shown in FIG. 16, the misalignment in the X and Y directions detected by the misalignment sensor unit 80a occurs in one of eight regions (regions β1, β2, . . . ,β8) if it is assumed that there is no misalignment when the pattern is detected in a region β0. Since the locational relationship between the misalignment sensor unit 80a and the misalignment sensor unit 80b is fixed, if one of them is offset to the right (regions β2, β3, or β4), That is, the location relationship between the misalignment sensor unit 80a and the misalignment sensor unit 80b can be represented by the following 27 combinations: [β2:β2]:β2:β3], [β2:β4], [β3:β2]β3:β3], β3; β4], [β4:β2][β4:β3], [β4:β4], [β1:β1], [β1:β0], [β1: 5], [β0:β1], [β0:β0], [β0::β5], [β5;β1], [β5:β5], [β8:β8], [β8:β7], [β8:β6], [β7:β8], [β7:β7], [β7:β6], [β6:β8], [β6:β7], and [β6:β6]([β2:β2] indicates that the misalignment sensor unit 80a is offset in the direction of the region β2 and that the misalignment sensor unit 80b is offset in the direction of the region β2). That is, according to the subject invention, the processing in step ST14 of the computer 44 shown in FIG. 14 corresponds to the determination means.

If there is no misalignment, the computer 44 proceeds to step ST 27 to provide an output indicating that the inspected circuit board is unacceptable in terms of continuity and short-circuiting. In this case, the result of the continuity and short-circuit test is unacceptable despite the absence of misalignment because the wiring pattern is defective. The absence of misalignment is represented by [β0:β0].

On the other hand, if there is misalignment, the computer 44 determines whether or not a predetermined number of misalignment corrections have been carried out (step ST 15). According to the subject invention, the predetermined number is 2.

In this case, the predetermined number of misalignment corrections have not been carried out, so a misalignment correction is executed (step ST17). The contents of the misalignment correction depend on whether or not there is misalignment. If misalignment is to be corrected, the circuit board may be pressed down so as not to be damaged even if the X-Y-Θ drive section 102 is activated.

If there is no misalignment in the Θ direction, that is, if the misalignment sensor units 8099a and 80b are misaligned in the same direction, a signal is output indicating a shift in the X and Y directions for a unit amount. The following is an example of the locational relationship between the misalignment sensor units 80a and 80b: [β1:β1], [β2:β3:β2], [β3:β3], [β4:β4], [β5:β5], [β6:ββ6], [β7:β7], or [β8:β8].

Figure 16B:
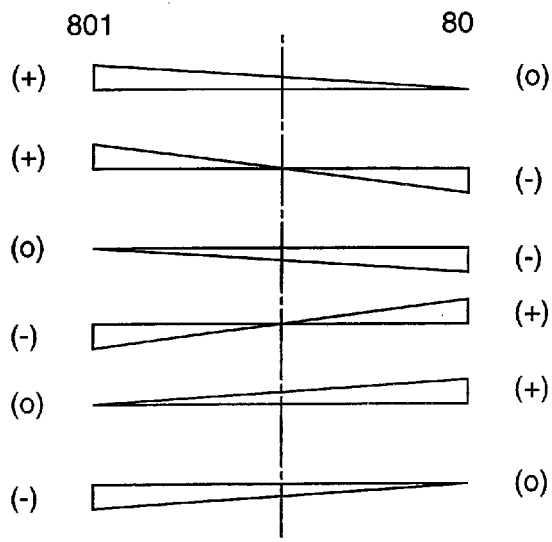
Figure 17A:
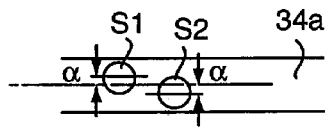
Figure 17C:
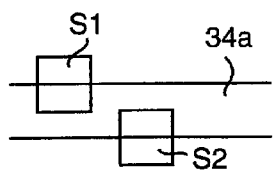
Figure 17B:
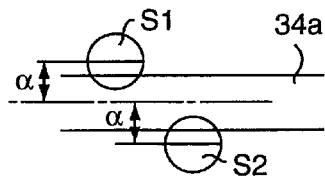
Figure 17D:
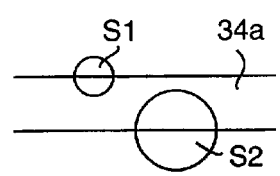
Figure 21:
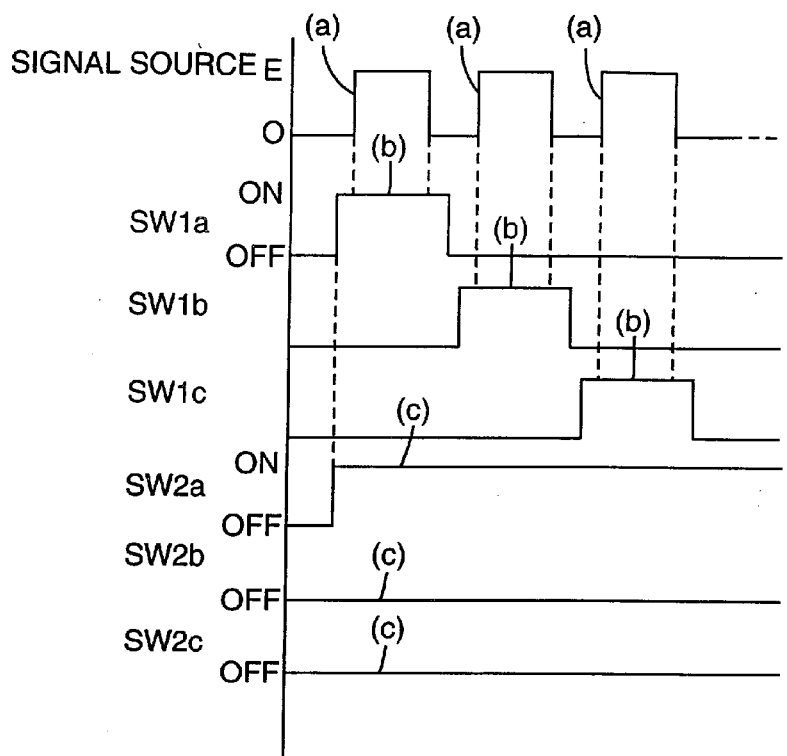

On the other hand, if there is misalignment in the Θ direction, that is, if the locational relationship between the sensor units is represented as [β2:β3], [β2:β4], [β3:β2], [β3:β4], [β4:β2], [β4:β3], [β1:β1:β0], [β1:β5], [β0:β1], [β0:β1], [β5:β1], [β5:β0], [β8:β7], [β8:β6], [β7:β6], [β6:β8] and [β6:β7], then the misalignment in the Θ direction must be corrected, In this case, the misalignment can be roughly classified into six directions as shown in FIG. 16B.

The six misalignments are as follows: v1) the misalignment sensor unit 80a: no misalignment and the misalignment sensor unit 80b: misalignment in the positive direction ([β3:β2], [β0:β1], or [β7:β8]); v2) the misalignment sensor unit 80a: misalignment in the negative direction and the misalignment sensor unit 80b: no misalignment ([β3:β4], [β0:β5], or [β8:β6]), v3) the misalignment sensor unit 80a: misalignment in the negative direction and the misalignment sensor unit 80b: no misalignment ([β3:β4], β0:β5], or β7:β8]); v4) the misalignment sensor unit 80a: misalignment in the positive direction and the misalignment sensor unit 80b: misalignment ([β2:β3], [β1:β0], or [β8:β7]) and v6) the misalignment sensor unit 80a: no misalignment and the misalignment sensor unit 80b: misalignment in the negative direction ([β4:β3], [β5:β0], or [β6:β7]).

This embodiment determines the rotational center in the Θ direction as follows. If one of the misalignment sensor units is misaligned in the positive direction and the other misalignment sensor units is misaligned in the negative direction (v2) or v 4)), the circuit board is rotated around the center between the misalignment sensor units 80a and 80b for a unit misalignment amount as shown in FIG. 16B. In the case of, for example, [β1:β5], the circuit board is rotated clockwise around the middle point 0.

In the other cases (v1), v3), v5), and v6)), the sensor units are rotated for a unit misalignment amount around the region of the misalignment sensor unit that indicates no misalignment. In the case of, for example, [β0:β5], the circuit board is rotated counterclockwise around the region Θ of the misalignment sensor unit 80a for a unit misalignment amount.

In the case of [β1:β0], [β1:β5], [β0:β1], [β0:β5], [β5:β1], or [β5:β0], the misalignment in the X and Y directions can be generally corrected by correcting the misalignment in the Θ direction. In other cases, that is, [β2:β3], [β2:β4], [β3:β2], [β3:β4], [β4:β2], [β4:β3], [β5:β1], [β8:β7], [β8:β6], [7:β8], [β7:β6], [β6:β8], and [β6:β7], the misalignment in the X direction must be further corrected. In the case of, for example, [β6:β7], the circuit board is rotated counterclockwise around the region β6 of the misalignment sensor unit 80a while being shifted in the X direction for plus one unit.

Thus, the misalignment can be corrected more promptly by determining to which regions the sensor units belong.

Next, the computer 44 conducts a continuity and short-circuit test (step ST7). If all patterns have passed the continuity and short-circuit test at step ST7, a signal is output indicating acceptability (step ST9). Otherwise, the computer 44 determines whether or not there is misalignment (step ST14). If not, it outputs a signal indicating that the results of the continuity and short-circuit test of this circuit board are unacceptable.

On the other hand, if there is misalignment, the computer 44 determines whether or not a predetermined number of misalignment corrections have been carried out (step S15). According to the subject invention, the predetermined number is 2, so a misalignment correction is executed again (step ST17).

Next, the computer 44 conducts a continuity and short-circuit test again (step ST7). If all patterns have passed the continuity and short-circuit test, a signal is output indicating acceptability (step ST9). Otherwise, the computer 44 determines whether or not there is misalignment (step ST14). If not, it outputs a signal indicating that the results of the test are unacceptable.

On the other hand, if there is misalignment, the computer 44 determines whether or not a predetermined number of misalignment corrections have been carried out (step S15). According to the subject invention, the predetermined number is 2. Thus, the computer determines that the required number of corrections have been executed and to step ST27 to output a signal indicating that the results of the continuity and short-circuit board are unacceptable.

In this manner, the continuity and short-circuit test is conducted while the circuit board is set in the inspection apparatus, and those circuit boards for which the results of the continuity and short-circuit test are unacceptable are corrected for misalignment a predetermined number of times, followed by another continuity and short-circuit test. Then, those circuit boards for which the inspection results are still unacceptable are rejected.

Figure 10:
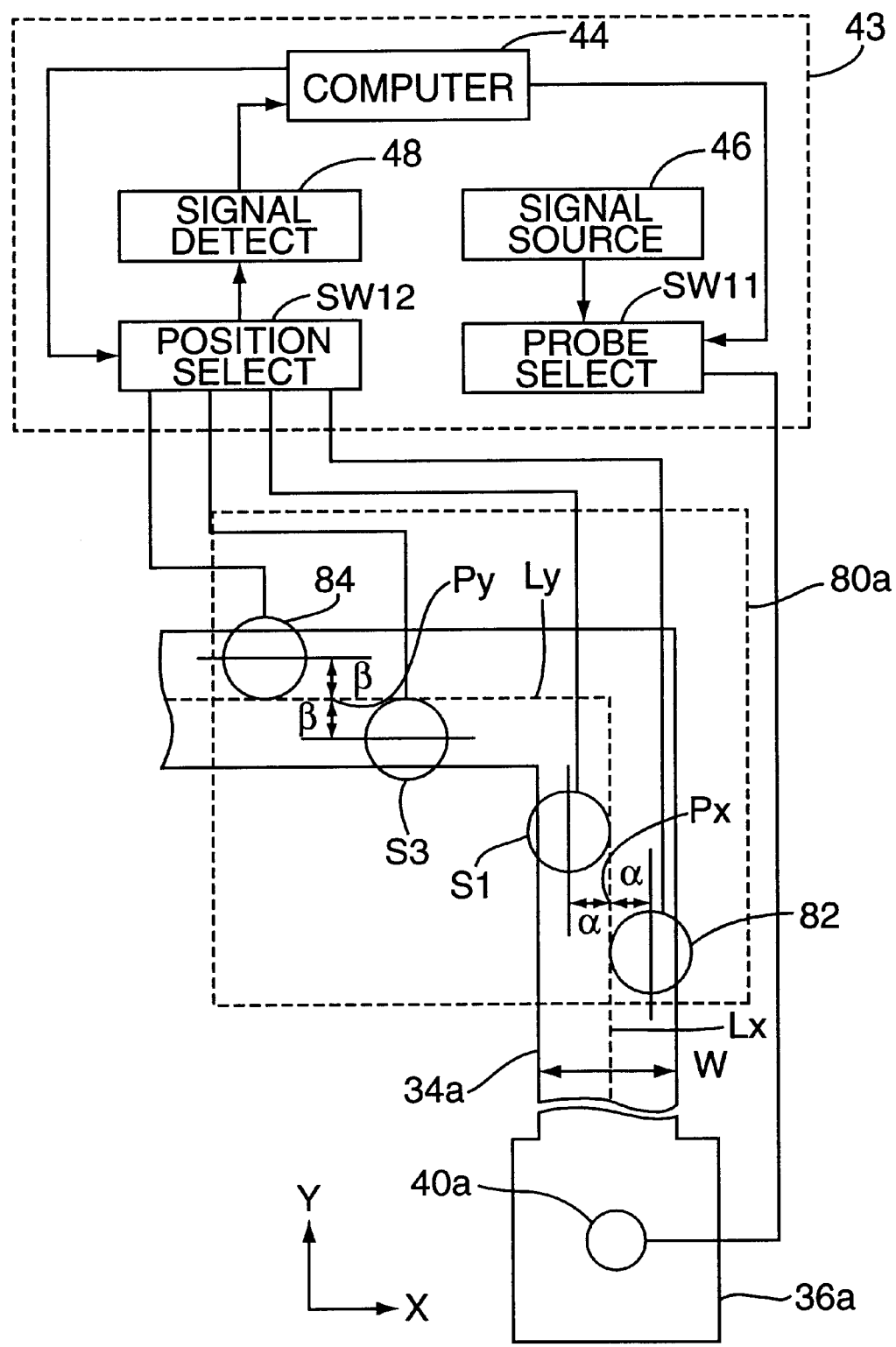
FIG. 10 illustrates the relationship between a misalignment sensor unit and a control section.

According to the subject invention, the unit shift amount in the X and Y directions is half the width W in FIG. 10. the shift in the Θ direction is the amount of rotation that causes a shift for half the width W in FIG. 10. This can prevent a shift in the opposite direction caused by excessive corrections.

As described above, this embodiment enables misalignment to be detected based on the wiring patterns present on the circuit board 32 without providing a separate camera mark on the circuit board 32.

Figure 17A:
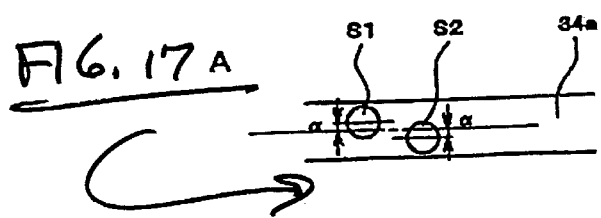
FIG. 17 shows another embodiment of the relationship between position detection electrodes and a printed pattern.
Figure 17C:
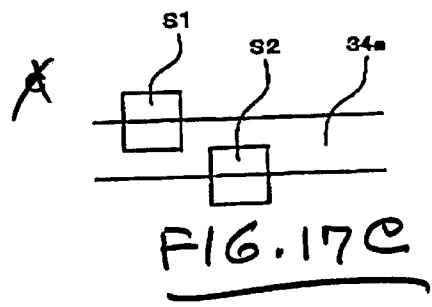
Figure 17B:
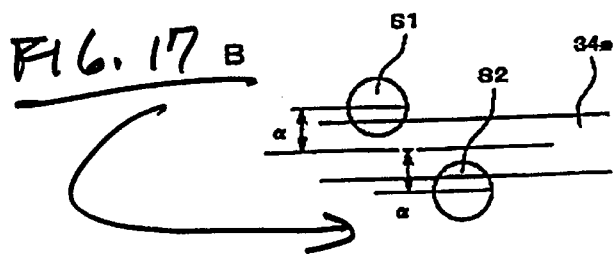
Figure 17D:
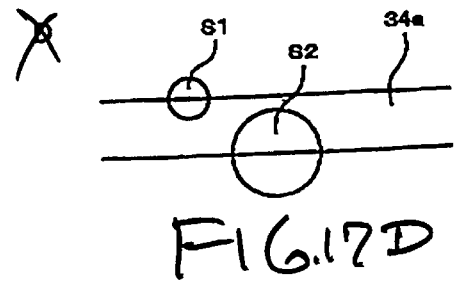

Another locational relationship between the position detection electrodes S1 and S2 and the printed pattern 34a will now be explained with reference to FIG. 17. The above embodiment has been described in conjunction with the case in which the center between the position detection electrodes S1 and S2 is located within the printed pattern 34a with part of the electrodes protruding from the pattern. In FIG. 17A, however, all of the electrodes are located over the printed pattern 34a, and the opposition area of the position detection electrode S1 or S2 varies if it is misaligned. In addition, the opposition area of the printed pattern 34a may be smaller than the area of the position detection S1 or S2, as shown in FIG. 17B. Furthermore, the position detection electrodes S1 and S2 may be polygonal (e.g., a quadrangle), as shown in FIG. 17C. Furthermore, the area ratio of the position detection electrode S1 to the position detection electrode S2 may be changed so as to maintain a predetermined relation between the gradients of signals for the measured electrostatic capacity if there is no misalignment, as shown in FIG. 17D.

Thus, the pair of position detection electrodes may be disposed so as to have different detected outputs if they are offset from the wiring pattern.

The above embodiment detects only the direction for the misalignment in the X,Y, and Θ directions, and corrects it by shifting the circuit board for a unit amount. The absolute amount of misalignment, however, can be obtained by detecting the magnitude of the difference between the first and second detections. For example, the change rate of the peak voltage in FIG. 13B may be calculated.

In addition, according to this embodiment, the signal detection section 48, which is a electrostatic capacity detection means, detects the electrostatic capacity using the peak voltage, but any quantity can be used as long as it enables the electrostatic capacity of the capacitor to be detected.

Further although the above embodiment has been described in conjunction with the use of the inspection apparatus for inspecting continuity and short circuiting based on variations in the electrostatic capacity, it can be used for an apparatus for inspecting continuity and short circuiting using a conventional probe.

Although the above embodiment detects the direction of misalignment and corrects it by shifting the circuit board for a unit amount, this direction may be detected by simply moving the circuit board in either direction and observing how the detected electrostatic capacity varies without detecting the direction of misalignment. This eliminates the need for two electrodes, contrary to the above embodiment. In addition, although two inspections using the misalignment sensor units 80a and 80b have been conducted, only one may be used to simplify the process by determining only the misalignment in the X and Y directions.

In addition, although this embodiment corrects the misalignment in the X, Y, and Θ directions at one time, a correction may be executed only in the Θ direction and continuity and short-circuit test at step ST5 may then be conducted, followed by the correction of the misalignment in the X and Y directions for only those circuit boards for which the result of the test is unacceptable. Conversely, a correction may be executed only in the X and Y directions and the continuity and short-circuit test at step ST5 may then be conducted, followed by the correction of the misalignment in the Θ direction for only those circuit boards for which the test result is unacceptable.

In addition, although the above embodiment uses the common probe 40a for the misalignment detection electrodes S1 to S4 of the misalignment sensor unit 80a, separate probes may be configured.

Thus, according to this embodiment, that part of the pattern present on the circuit board which is suitable for the detection of misalignment can be used without forming a special pattern for the detection of misalignment. Although the misalignment sensor units 80a and 80b must be provided in the inspection jigs, this operation does not make this method particularly cumbersome because the inspection jigs must always be adapted for the inspected circuit board.

Although this embodiment disposes the misalignment sensor units 80a and 80b in parallel with the Y axis, the subject invention is not limited to this aspect, and the sensor units may be disposed at a predetermined angle from the Y axis (45°, etc.). To achieve high accuracy, the position sensor units 80a and 80b should be separated from each other as far as possible.

Figure 18:
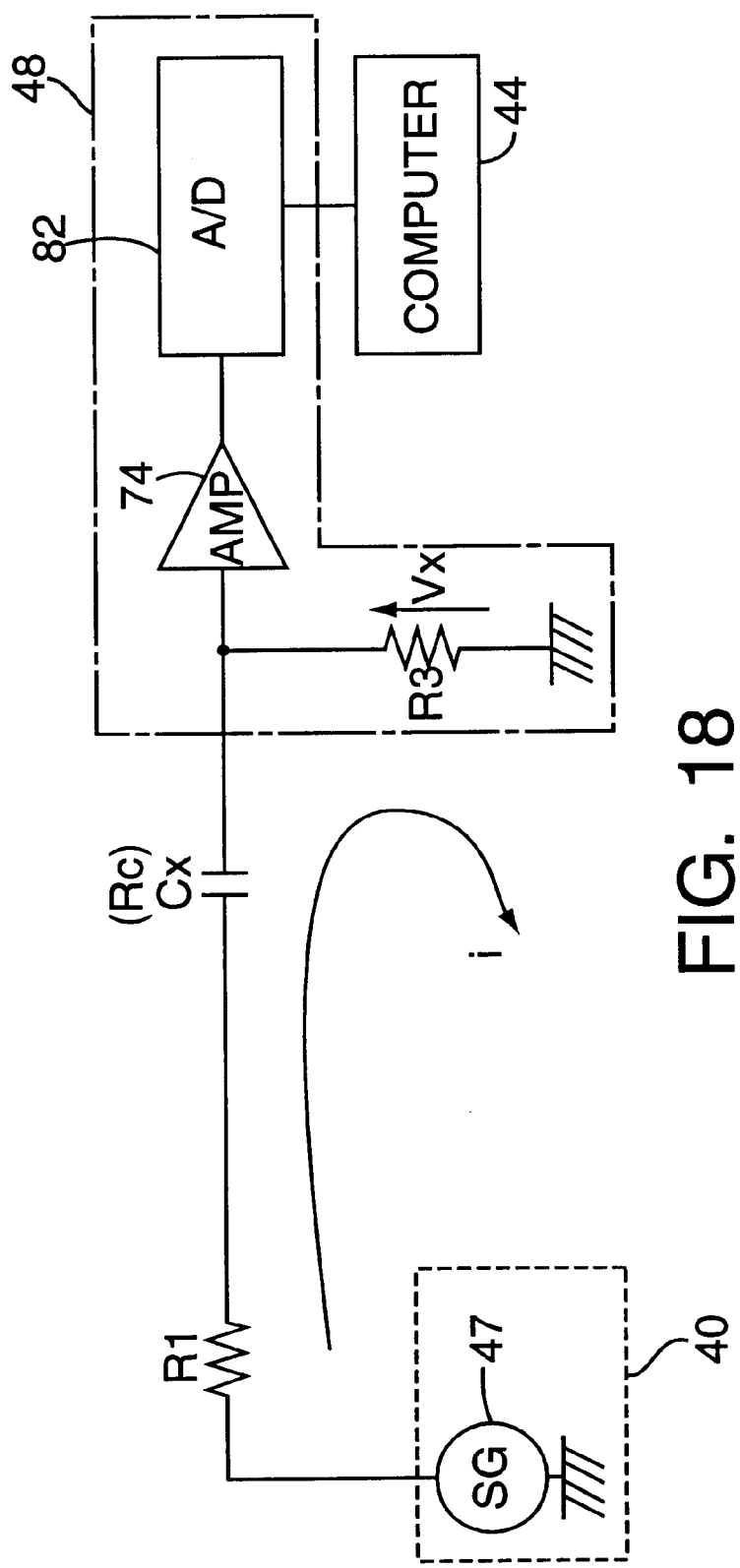
FIG. 18 shows an equivalent circuit in which an AC generator is used as a signal source.

In addition, a signal generator 47 may be used as the signal source 46, as shown in FIG. 18. The size of the misalignment detection electrodes S1 to S4 and the gap (t) between them may be set so that, for example, the following values can be obtained: the generated voltage =20V, the frequency=about 20 kHz, the internal resistance R1=1KΩ and R3=1 MΩ, and the electrostatic capacity Cx=100 pF. In this case, the detected voltage Vi can be expressed by the following equation.

$$Vi=VO-Ri/(R1+Rc+R3)$$

$$(Rc=1/2\pi fc)$$

By selecting the above numerical values, a voltage is detected that is almost in proportion to the electrostatic capacity of the capacitor.

Figure 19A:
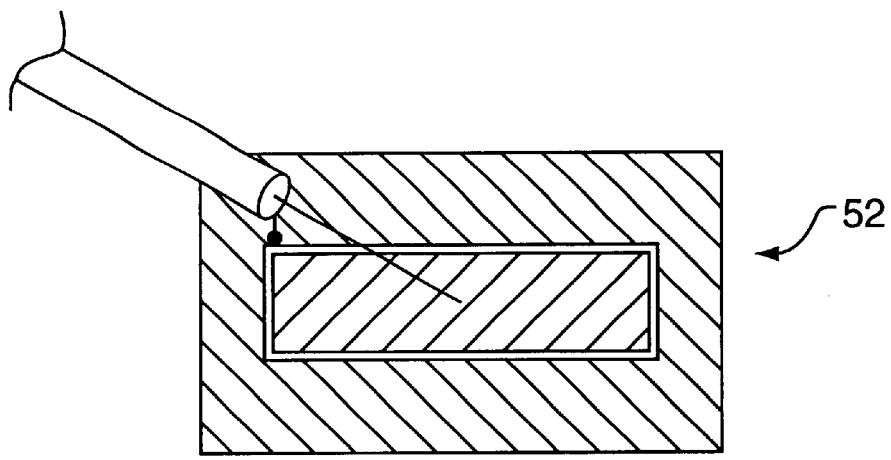
FIG. 19A is a plan view schmatically illustrating a continuity sensor unit in another example.
Figure 19B:
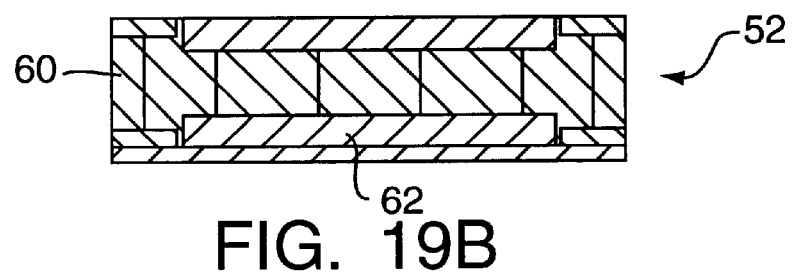
FIG. 19B is a cross sectional view schedmatically illustrating the integral part of the continuity sensor unit.
Figure 19C:
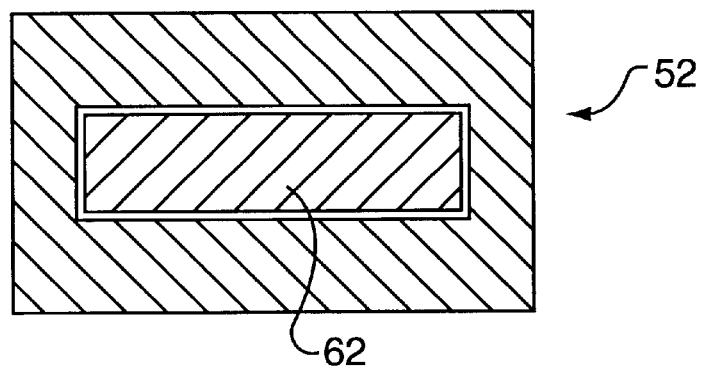
FIG. 19C is a bottom view schematically illustrating the continuity sensor unit
Figure 20A:
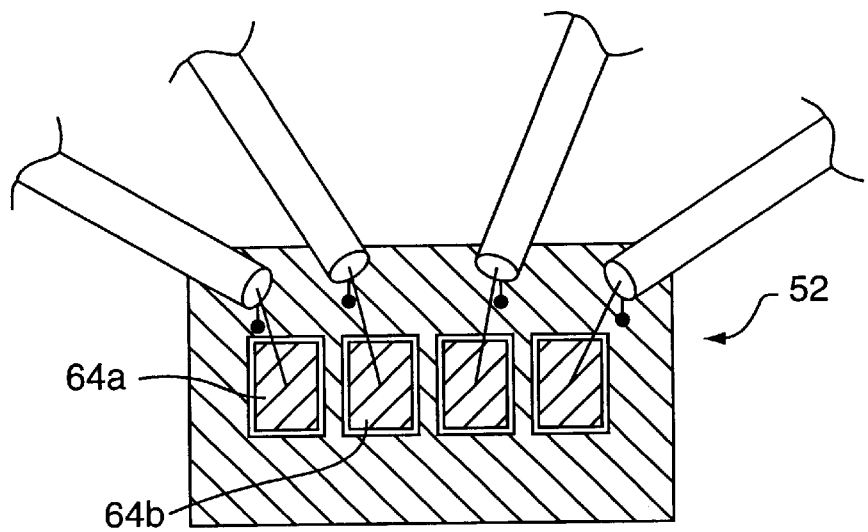
FIG. 20A is a plan view schematically illustrating a continuity sensor unit in yet another example.
Figure 20B:
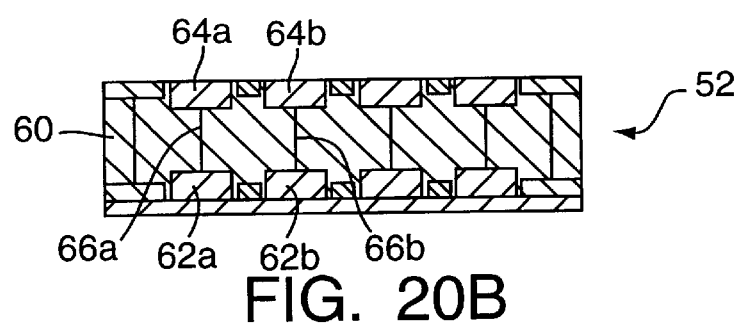
FIG. 20B is a cross-sectional view schematically illustrating the integral part on the continuity sensor unit of FIG. 20A.
Figure 20C:
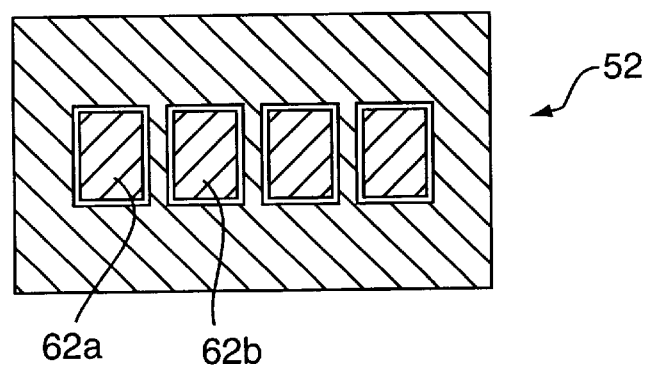
FIG. 20C is a bottom view schematically illustrating the continuity sensor unit of FIG. 20A.

In each continuity sensor unit, a large electrode plate 62 is provided on the bottom surface of the circuit board 60, as shown in FIGS. 19A to 19C. In this case, the single large electrode plate 62 of the continuity sensor unit 52 is coupled to the group of pads 38a, 38b, . . . (see FIG. 4) corresponding to the continuity sensor unit 52. This configuration reduces the variation in electrostatic capacity between the electrode plate 62 and the group of pads 38a, 38b, . . . shown in FIG. 4.

In addition, a plurality of connection plates 64a, 64b, . . . may be provided on the top surface of the circuit board 60 and individually connected to the electrode plates 62a, 62b, . . . via through-holes 66a, 66b, . . . so as to individually obtained signals from the connection plates 64a, 64b, . . . This configuration enables the plurality of pads 38a, 38b, . . . shown in FIG. 4 to be individually subjected to signal processing. This in turn allows more precise processing and enables more complicated printed patterns to be inspected. In this case, each pad 38a, 38b, . . . forms a group. That is, each group is composed of only one pad.

In addition, the above embodiment integrates the four continuity sensor units 52, 54, 56, and 58 together to form the continuity sensor module 50. This enables easier handling compared to the separate use of a plurality of continuity sensor units. In addition, the integral continuity sensor module 50 can be positioned relative to the circuit board 32 to improve the working efficiency. These continuity sensor units may be separately formed instead of being integrated together.

Although the above embodiment activates the switch SW1b while maintaining the switch SW1a in an activated state (see FIGS. 9(c) and (e)), the switch SW1a may be deactivated immediately after the peak hold circuit 76 has finished a maximum value detection (the detection of the maximum value of the voltage Va) for the printed pattern 34a, followed by the activation of the switch SW1b. This configuration allows the inspection to shift to the next printed pattern 34b without waiting for the current (i) flowing through the printed pattern 34a to become almost zero. This in turn enables the continuity of the printed pattern to be inspected in a much shorter cycle. This configuration also prevents the inspection cycle from being excessively long even if the time constant (the inverse number of α in Equations (1) and (2)) is large.

In addition, the above embodiment uses the constant-voltage source as the signal source 46 (see FIG. 9(a)) and activates and deactivates each switch of the probe selection switch section SW1 (see FIGS. 9(c) and (e)) to change a DC voltage output from the signal source 46 to a step-like voltage with a sharp rising edge. A circuit that sequentially generates signals with rapid changes, however, may be used as the signal source 46.

Figure 21:
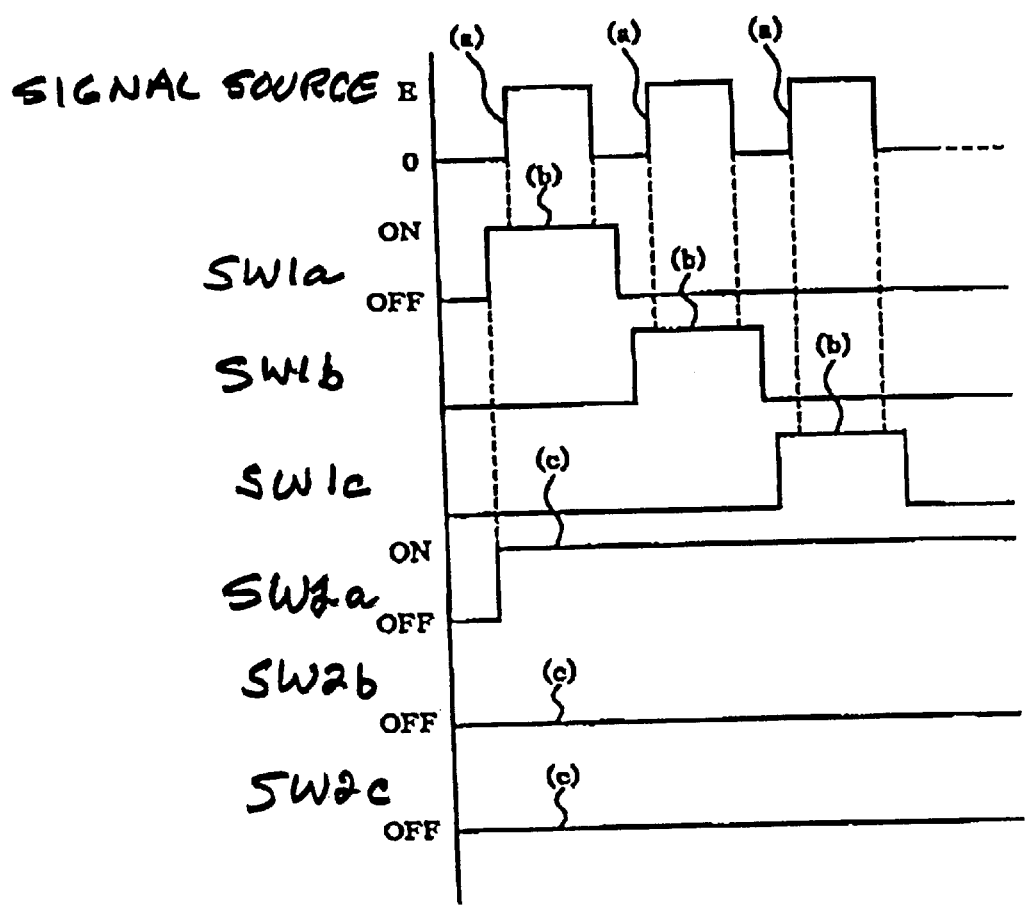
FIG. 21 is a timing chart for signal processing according to another example.

FIG. 21 shows a timing chart for signal processing executed if the above signal source 46 is used. This example uses a rectangular-wave generation circuit as the signal source 36. The computer 44 switches each switch of the probe and block selection switch sections SW1 and SW2 (FIGS. 21 (b) and (c)) almost in synchronism with the phase of the rising edge of each rectangular signal generated by the signal source 46 (see FIG. 21 (a)) in order to distribute to each printed pattern 34a, 34b, . . . (see FIG. 3) each rectangular wave sequentially generated by the signal source 46. The input voltage Vx to the amplifier 74 and the processing after the input to the amplifier 74 are the same as in the example shown in FIG. 9.

Figure 22A:
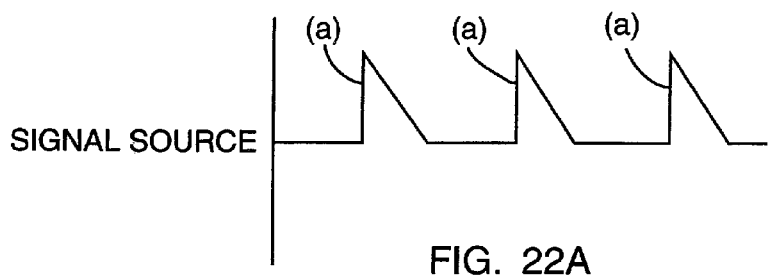
FIG. 22A shows a signal in another example which is output from a signal source.
Figure 22B:
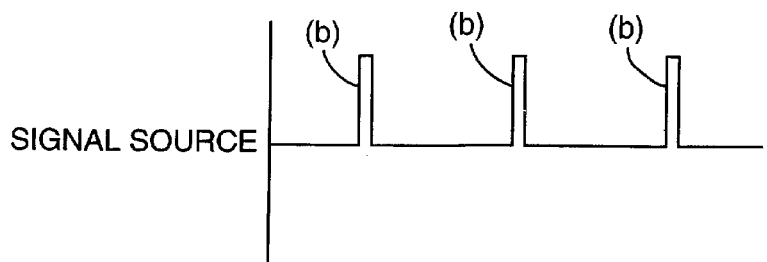
FIG. 22B shows a signal output from the signal source in FIG. 22A.
Figure 26:
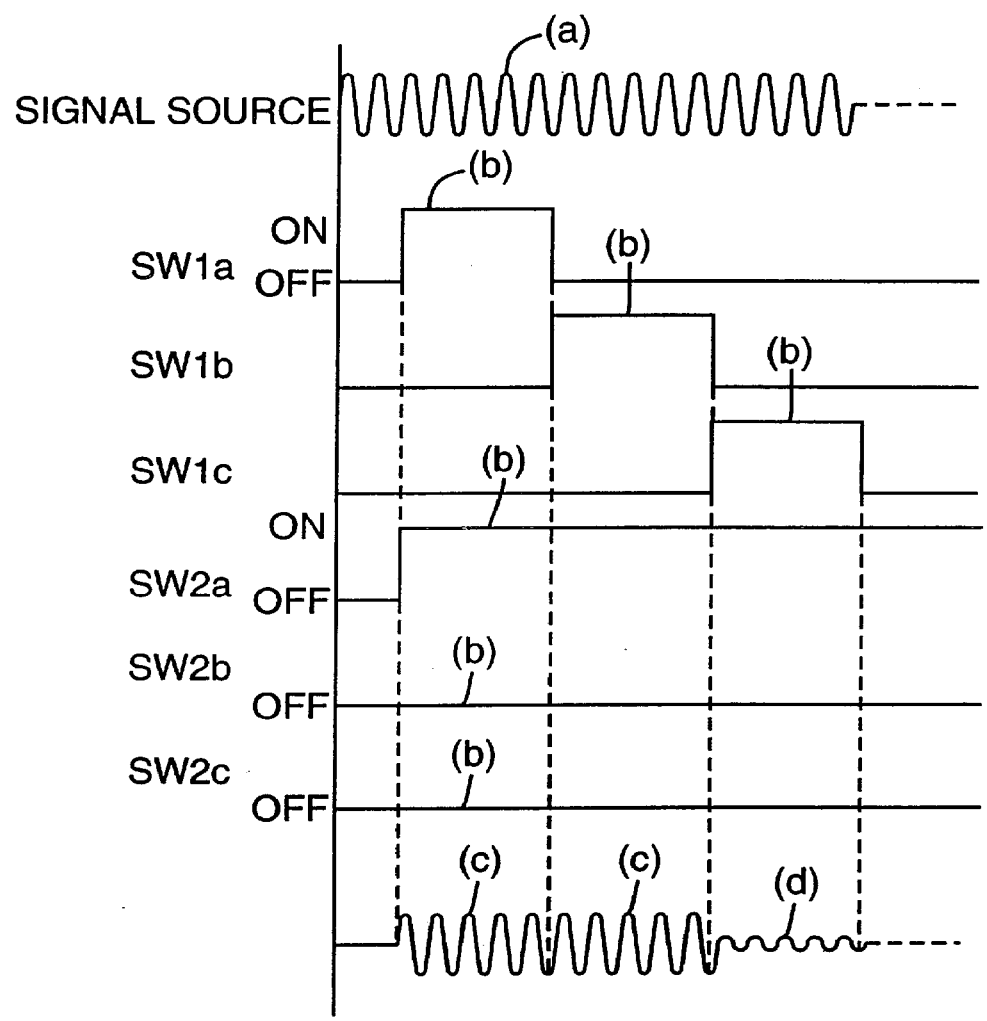

In the example shown in FIG. 21, the signal source 46 generates rectangular waves, but may alternatively generate triangular waves as shown in FIG. 22A. In FIG. 22a, each triangular wave has a sharp rising edge (a). The signal source 46 may also generate a pulse train as shown in FIG. 22B. As in FIG. 22A, each pulse signal in FIG. 22B has a sharp rising edge (b).

Signals with a sharp rising edge are not limited to those described above. Besides signals rising at time 0, those which rise with a certain delay are included. Those signals having a sharp falling edge are also included.

Although the above embodiment determines the continuity of the wiring based on the maximum voltage generated at the second terminal after the signal has changed rapidly, the subject invention is not limited in this respect. The continuity of the wiring can be determined based on, for example, the quantity relating to the voltage generated between the first and second terminals when a signal with a rapid change is supplied, such as the average over a predetermined time of the voltage generated between the first and second terminals, the value of the voltage after a predetermined time, the steady-state deviation voltage, or the maximum, average, or integral value of the current flowing between the first and second terminals, after the signal has changed rapidly. The continuity of the wiring, however, can be inspected in a shorter time by determining the continuity of the wiring based on the maximum voltage.

Although the above embodiment has been described in conjunction with the sensor module composed of the plurality of second terminals (the continuity sensor units 52, 54, 56 and 58), the subject invention is applicable to a sensor module composed of only one second terminal.

Figure 23:
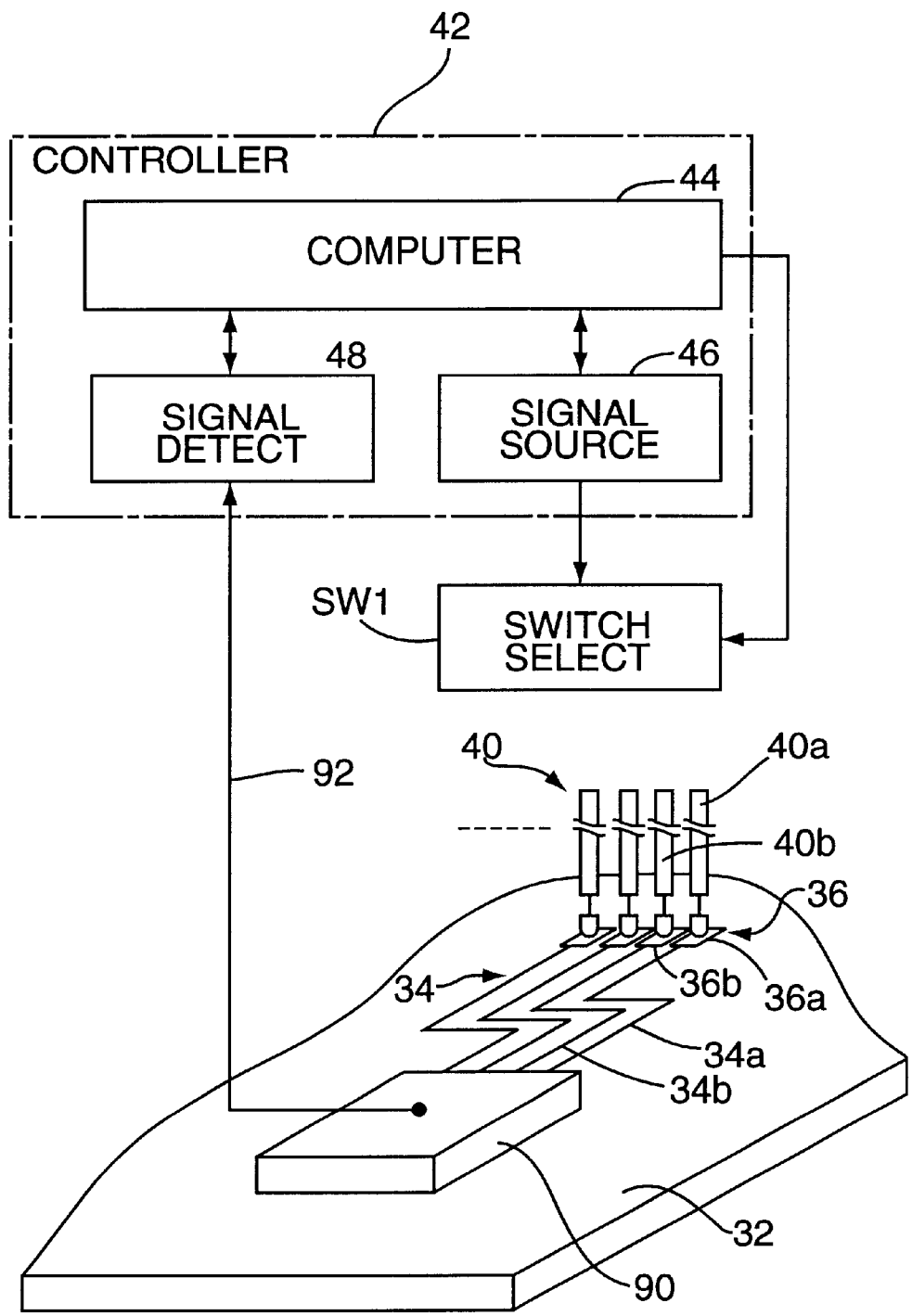
FIG. 23 shows the configuration of a bare board tester that is a circuit board inspection apparatus according to a second embodiment of the invention.

FIG. 23 shows a bare board tester that uses a sensor module 90 composed of only one second terminal.

The controller 42, probe selection switch section SW1, and probe section 40 are configured as in the bare board tester shown in FIG. 3. The bare board tester shown in FIG. 23 has only one output from the sensor module 90. Thus, the block selection switch section SW2 for switching the output from the continuity sensor module 50 to supply it to the signal detection section 48 is not provided as in FIG. 3.

The sensor module 90 disposed on the pad section 38 (see FIG. 4) of the circuit board 32 is coupled to the pad section 38 to obtain a signal therefrom and to provide it to the signal detection section 48.

Figure 24A:
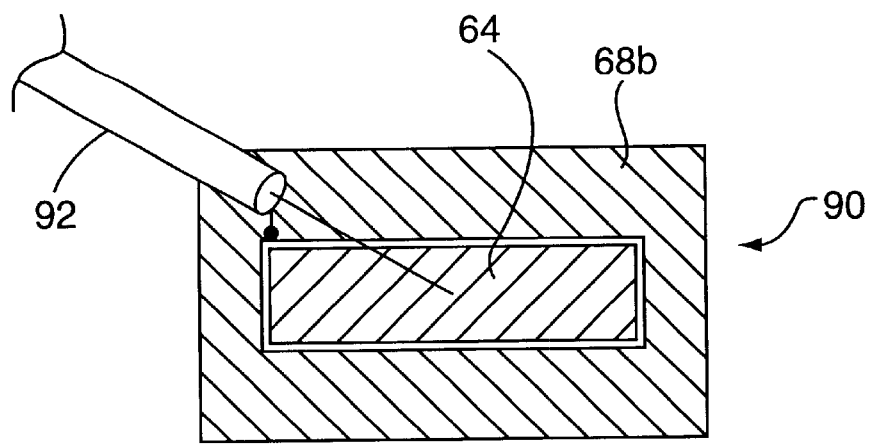
FIG. 24A is a plan view of a sensor module.
Figure 24B:
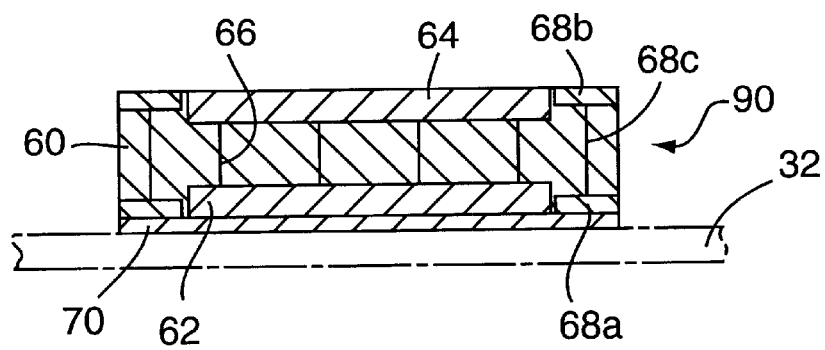
FIG. 24B is a cross-sectional view showing the integral part of the sensor module.
Figure 24C:
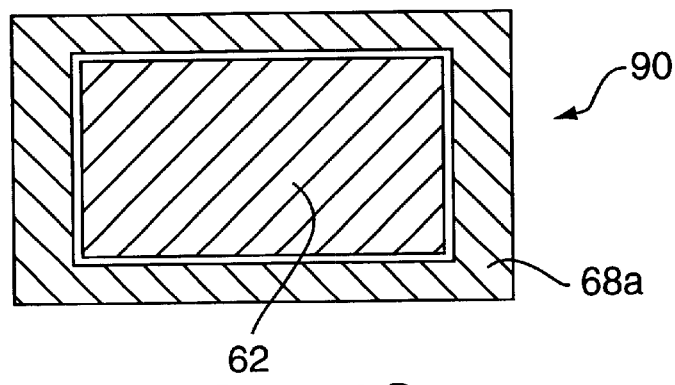
FIG. 24C is a bottom view of the sensor module.

FIGS. 24A, 24B, and 24C show the configuration of the sensor module 90. The sensor module 90 is composed of the circuit board 60 (see FIG. 24B) manufactured using a process similar to that for the inspected circuit board 32, as in the above embodiment.

As shown in FIGS. 24B and 24C, one electrode plate or electrode section 62 is provided on the bottom surface of the circuit board 60, and the insulating film 70 is formed so as to cover the plate 62. The electrode plate 62 is opposed to the pad section 38 of the inspected circuit board 32 and capacitively coupled to all pads 38a, 38b, . . . in the pad section 38 (see FIG. 2) via the insulating film 70. This configuration reduces the variation in electrostatic capacity between the electrode plate 62 and the group of pads 38a, 38b, . . . shown in FIG. 4.

Connection plate 64 is provided on the top surface of the circuit board 60 as shown in FIGS. 24B and 24A. The plate 64 is electrically connected to the electrode plate 62 via the through-hole 55 and is connected to the signal detection section 48 via connection cord 92.

Shield films or members 68a, 68b are formed on the top and bottom surfaces of the circuit board 60, respectively, as shown in FIGS. 24A, 24B, and 24C and are connected together via through-hole 68c. A ground potential is provided to the films 68a. 68b.

Signal processing by the bare board tester shown in FIG. 22 is almost the same as in the bard board tester shown in FIG. 1. In this case, however, the processing for the block selection switch section SW2 is not carried out.

As will be apparent, all or part of the functions of the computer 44 shown in FIGS. 3 and 12 can be implemented using hardwired logic. In addition, all or part of the functions of the signal detection section 48 can be implemented using software.

The above embodiment disposes the shield members around the electrode. This configuration reduces noise. However, a configuration without shield members is also possible.

In addition, although the above embodiment provides on the second terminal the insulating film covering the electrode section, the second terminal can be configured without such film. By providing the film on the second terminal, however, the inspection can be conducted rapidly because a separate insulating film need not be prepared prior to the inspection.

Although the above embodiment provides the electrode section on one side of the circuit board constituting the sensor module and on the other side a conductive connection section electrically connected to the electrode section, the conductive connection section need not be provided on such other side. By providing the conductive connection section on the other side, however, signals may be easily transmitted and received via this section, thereby simplifying the structure of the sensor module.

In addition, although the above embodiment is composed of a sensor module of a circuit board manufactured using a process similar to that for the inspected circuit board, the sensor module may be composed of a circuit board manufactured using a process dissimilar to that for the circuit board, or may even be configured without a circuit board. By manufacturing the sensor module using a process similar to that for the inspected circuit board, however, even if the wiring on the inspected circuit board is made denser or more complicated, the sensor module can be adjusted accordingly.

Still further, although the above embodiment capacitively couples the second terminal to the other end of the wiring; for example, the second terminal can be inductively coupled to the other end of the wiring. With capacitive coupling, however, reliable inspections are possible with a simple configuration.

Still further, although the above embodiment has been described in conjunction with a signal with a rapid change as the predetermined signal for inspection, the subject invention is not limited in this respect. For example, AC signals such as sine-wave alternating current signals can be used.

Figure 25:
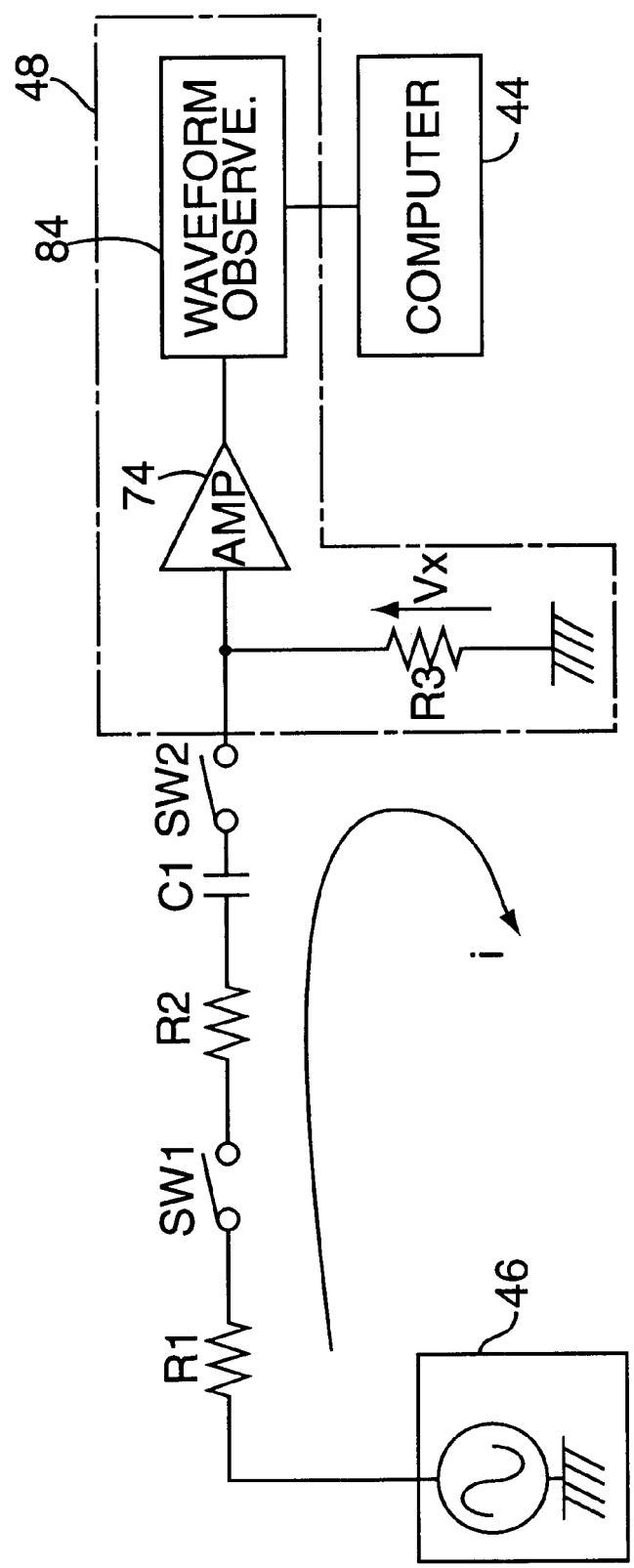
FIG. 25 illustrates signal processing according to the second embodiment.

If an AC signal is used, for example, a sine-wave oscillator may be used as the signal source 46 as shown in FIG. 25. For example, a sine wave having frequency of about 10 MHz can be generated by the signal source 46. In addition, instead of the peak hold circuit 76 in FIG. 8, a wave form observation circuit 80 may be used as an element constituting the signal detection section 48. The waveform observation circuit 80 then processes an input signal to evaluate its level and waveform and may be specifically a detection circuit or an oscilloscope.

Figure 26:
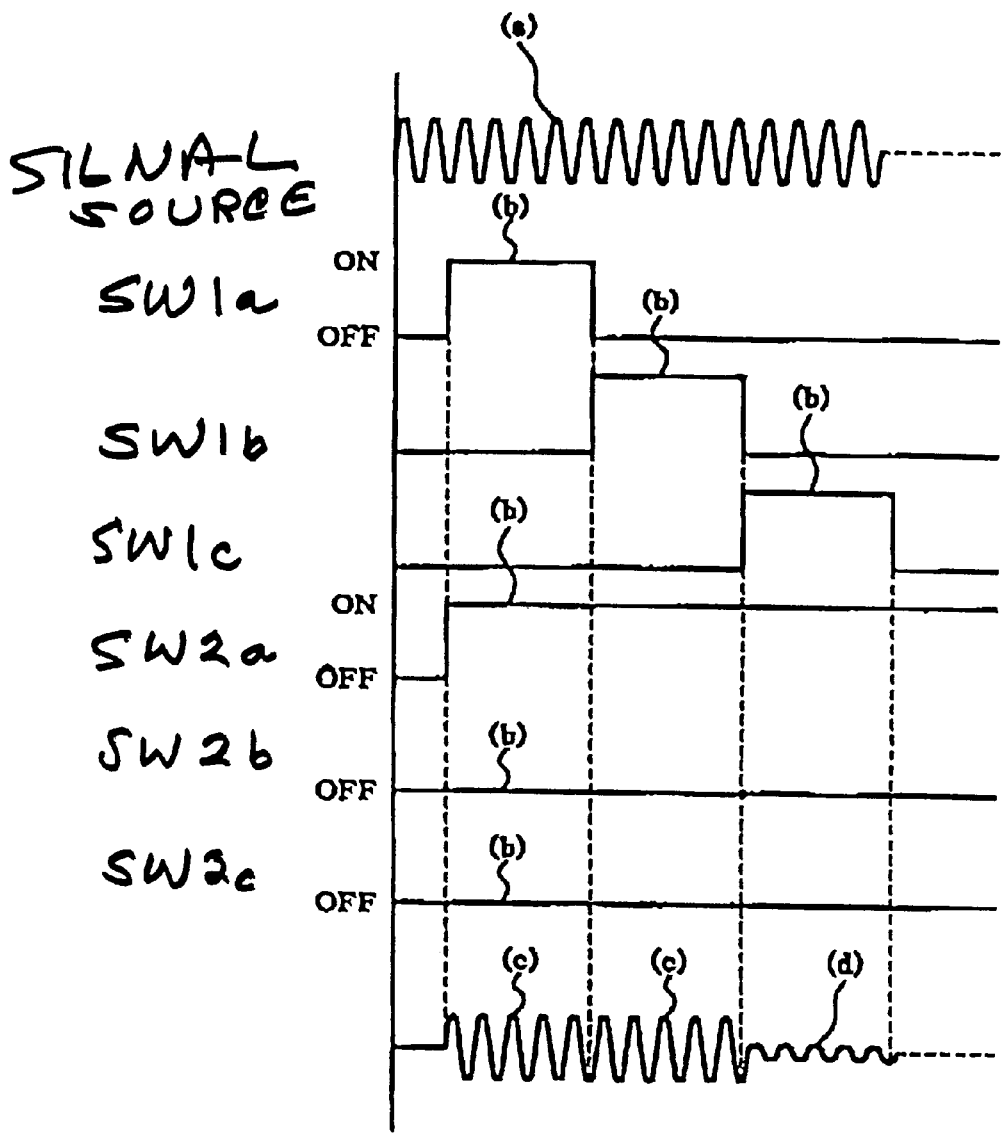
FIG. 26 is a timing chart for signal processing according to the second embodiment.
Figure 11:
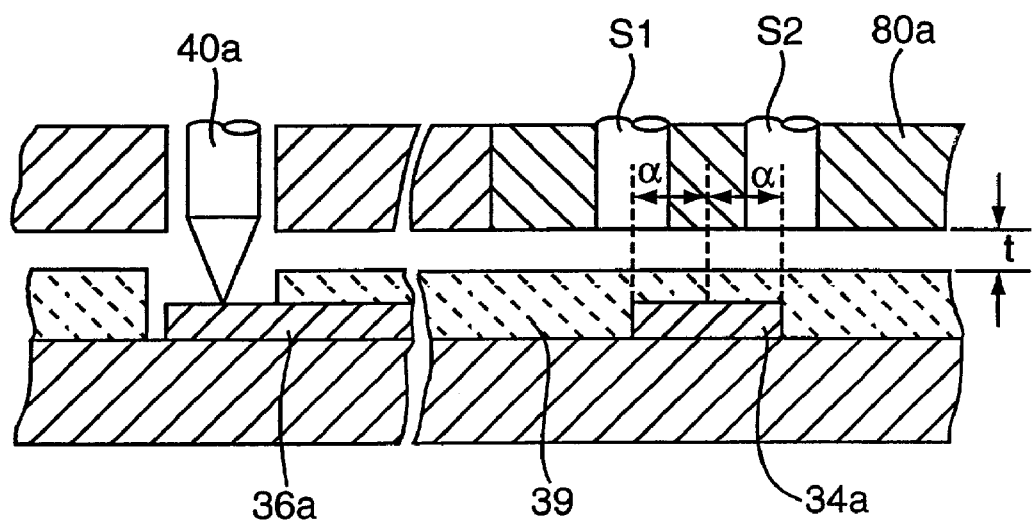
Figure 13A:
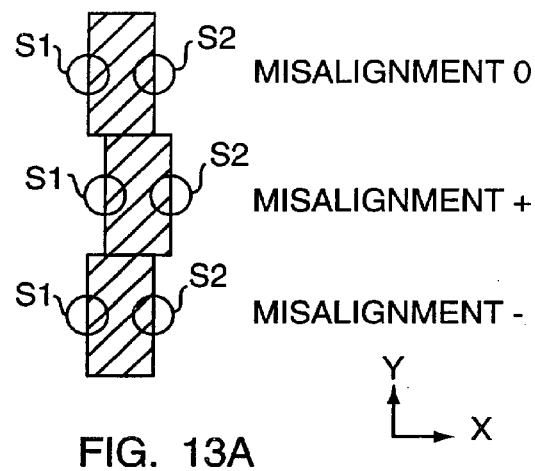
Figure 13B:
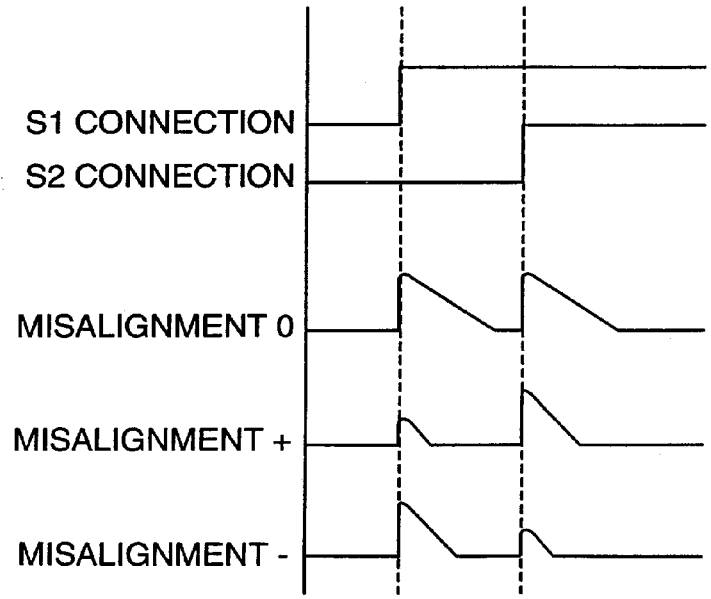
Figure 14:
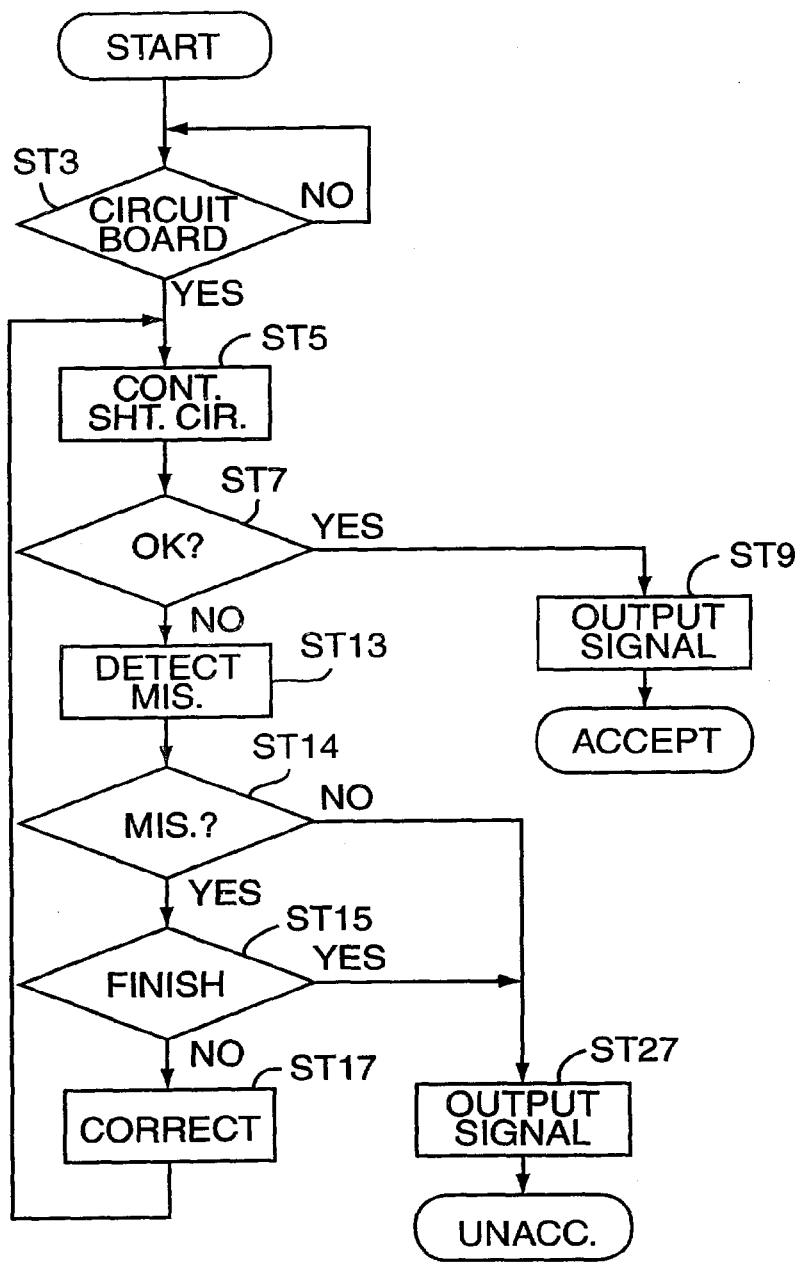
Figure 15:
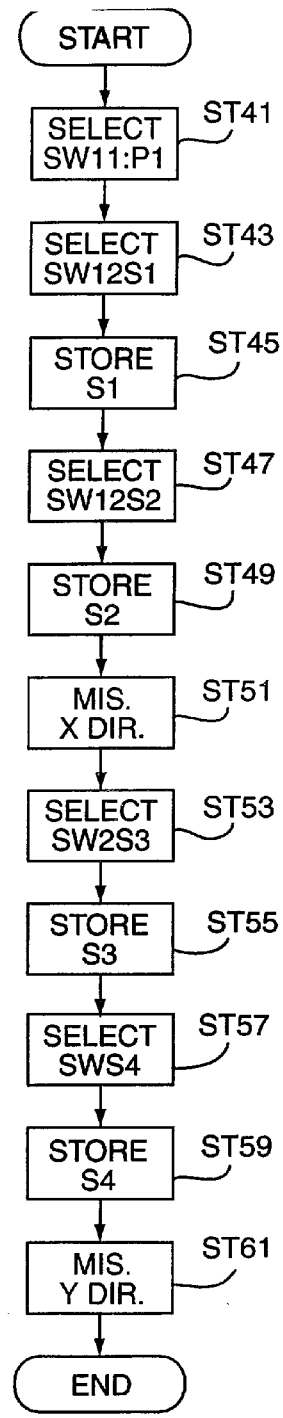

In this case, the computer 44 will operate each switch of the probe and block selection switch sections SW1 and SW2 as required (see FIG. 26(b)) to distribute sine waves generated by signal source 46 (see FIG. 26(a)) to each printed pattern 34a, 34b, 34c, while determining the continuity of each printed pattern based on data obtained via the signal detection section 48.

If the printed pattern is not open-circuited, the input voltage Vx to the amplifier 74 will be as shown in (c). On the other hand, if the printed pattern is open-circuited, the input voltage Vx to the amplifier 74 will be as shown in (d). That is, if the printed pattern is open-circuited, the input level will have a very small value, which can be determined easily. In the example in FIG. 26, the printed patterns 34a and 34b are normal, whereas the printed pattern 34c is open-circuited Thus, the circuit board 32 is determined to be unacceptable.

The use of an AC signal enables the apparatus to be composed of a circuit such as a sine-wave oscillator or a detection circuit often used in non-contact inspection apparatus. As a result, design costs of the apparatus and the delivery time can be reduced and existing parts can be used without modification to reduce manufacturing costs.

In addition, although the above embodiment positively connects the first terminal to one end of the wiring, the first terminal may be capacitively coupled to one end of the wiring.

In addition, the above embodiment prepares the plurality of first terminals and uses the first switch means to select a desired first terminal in order to select a desired end of the wires on the inspected circuit board. However, only one first terminal may be prepared and the inspected circuit board may be moved relative to this first terminal to select among the ends of the wires. The first configuration, however, eliminates the need to move the inspected circuit board relative to the first terminal. As a result, accurate inspections are more readily obtained, the manufacturing costs of the apparatus can be reduced, and the inspection can be easily automated.

A probe may also be added to the base 117a of the lower jig 117 for detecting the circuit pattern on the underside of the circuit board 32. In this case, both sides of the circuit board 32 can be simultaneously inspected.

This configuration is also applicable to a universal inspection apparatus.

In addition, although the above embodiment has been described in conjunction with the bare board tester, the subject invention is not limited to such a tester. The invention is applicable to general circuit board inspection apparatus and methods such as inspection apparatus for circuit boards on which circuit elements such as CPUs are mounted or packages on which circuit elements are to be mounted.

Terms used herein will be described below.

The term "circuit board" refers to a base material on which wiring can be or has been formed and is not limited in terms of its material, structure, shape, or size. It includes, for example, glass epoxy substrates and film-lime substrates as well as packages on which circuit elements such as CPUs are to be mounted. It further includes composite substrates wherein sockets are mounted on a glass epoxy substrate and substrates on which circuit elements are mounted.

The term "wiring" refers an electrical conductor and is not limited in terms of its material, structure, shape, or size. This includes the conductive part of printed patterns, through-holes, and pins formed in a circuit board, electric cords, sockets, connectors, and pins attached to the circuit board.

The term 5 "one end of the wiring" and "the other end of the wiring" refer to the points of the wiring to and from which signals for inspections are input and output and are not limited in terms of material, structure, shape, or size. The terms include points that are electrically connected to other parts, such as printed pattern inspection ends, connector connection ends, connection pins, pads for connecting bonding wires, pads for connecting circuit elements or sockets, insertion portions provided in sockets attached to circuit boards, and the input and output ends of connectors, as well as arbitrary sites in the wiring.

The term "coupling" refers to the coupling of two or more members in such a way that they can transmit and receive signals to and from one another while remaining insulated from one another. It includes the use of electrostatic capacity and inductance.

The term "signal" refers to a signal use for inspections. This includes but is not limited to voltage and current. Besides AC signals such as sine waves, it includes DC signals, rectangular and triangular signals, and pulse-like signals.

The expression "based on the voltage generated between the first and second terminals" means that something is based on the voltage generated between the first and second terminals or a physical quantity corresponding or relating to this voltage. Thus, it includes not only the voltage but also a current corresponding or relating to the voltage or its integral or differential value.

The term "detection of the continuity of the wiring" is a concept including the detection of an open or short circuit of the wiring and the detection of the resistance value of the wiring such as the detection of a half-open-circuit.

The term "group" refers to a group composed of one, two, or more elements.

The term "signal with a rapid change" refers to a signal with a large amount of variation in voltage or current per unit time and includes DC signals with a step-like rising or falling edge, triangular and rectangular signals, and pulse-like signals.

The term "electrode section" refers to a conductor constituting the electrode on the second terminal when an electrostatic capacity is used for coupling and the electrode section is not limited in terms of its material, structure, shape, or size.

What is claimed is:

1. A method for detecting misalignment between printed circuit patterns on a circuit board at its inspection position and probes carried on a jig for the circuit pattern conductivity inspection in a printed circuit board inspection apparatus, the method comprising the steps of:

bringing the circuit board and probes into their relative inspection positions;

facing a pair of electrodes with a gap to respective predetermined portions of an electrically conductive wiring of the circuit patterns to form capacitive couplings between the electrodes and the portions of the conductive wiring, the electrodes being associated with the jig to move correspondingly and arranged such that the electrodes are at different positions along the center line of the conductive wiring and in the direction of width of the conductive wiring, and when the circuit patterns and the probes are at expected relative positions, the electrodes being located such that the electrodes are point symmetrical with each other with respect to a point on a center line extending along the center of the conductive wiring and that the electrodes cover the same amount of areas of the conductive wiring;

supplying a test signal to the conductive wiring, the test signal being of the nature changing its electric parameter to be transmitted through the capacitive coupling;

comparing the test signals transmitted to the electrodes through the capacitive couplings, the transmitted test signal being representative of the areas of the circuit pattern faced by the electrodes; and determining alignment between the probes and circuit patterns in accordance with the comparison.

2. A method for detecting misalignment between the printed circuit patterns and the probes according to claim 1, further comprising the steps of:

facing a second pair of electrodes with a gap to respective predetermined portions of a second electrically conductive wiring of the circuit patterns to form capacitive couplings between the second pair of electrodes and the portions of the conductive wiring, the second conductive wiring being at right angle with the first conductive wiring, the second pair of electrodes being associated with the jig to move correspondingly and arranged such that the electrodes are at different positions along the center line of the second conductive wiring and in the direction of width of the second conductive wiring, and when the circuit patterns and the probes are at expected relative positions, the electrodes being located such that the electrodes are point symmetrical with each other with respect to a point on a center line extending along the center of the second conductive wiring and that the electrodes cover the same amount of areas of the second conductive wiring;

supplying a test signal to the second conductive wiring, the test signal being of the nature changing its electric parameter to be transmitted through the capacitive coupling;

comparing the test signals transmitted to the second pair of electrodes through the capacitive couplings, the transmitted test signal being representative of the areas of the conductive wiring faced by the second pair of electrodes; and determining alignment between the probes and circuit patterns in accordance with the comparisons of test signals transmitted to the first and second pairs of electrodes.

3. A method for detecting misalignment between the printed circuit patterns and the probes according to claim 1, further comprising the steps of:

inspecting conductivity of the circuit patterns in advance of the detection of the misalignment; and conducting detection of the misalignment when discontinuation of any circuit pattern is detected.

4. A method for detecting misalignment between the printed circuit patterns and the probes according to claim 2, wherein the first and second conductive wirings are electrically connected with each other, and a test signal is being supplied to the first and second circuit patterns.

5. A method for detecting misalignment between the printed circuit patterns and the probes according to claim 1, wherein the step of supplying a test signal including a substep of turning on a switch to connect a constant voltage source to the circuit patter faced by the probes.

6. A method for detecting misalignment between printed circuit patterns on a circuit board at its inspection position and probes carried on a jig for the circuit pattern conductivity inspection in a printed circuit board inspection apparatus, the circuit board having a reference wiring formed thereon, the method comprising the steps of:

facing a pair of electrodes with a gap to respective predetermined portions of the reference wiring to form capacitive couplings between the electrodes and the portions of the reference wiring, the electrodes being associated with the jig to move correspondingly and arranged such that the electrodes are at different positions along the center line of the reference wiring and in the direction of width of the reference wiring, and when the circuit patterns and the probes are at expected relative positions, the electrodes being located such that the electrodes are point symmetrical with each other with respect to a point on a center line extending along the center of the reference wiring and that the electrodes cover the same amount of areas of the reference wiring;

supplying a test signal to the reference wiring, the test signal being of the nature changing its electric parameter to be transmitted through the capacitive coupling;

comparing the test signals transmitted to the electrodes through the capacitive couplings, the transmitted test signal being representative of the areas of the reference wiring faced by the electrodes; and determining alignment between the probes and circuit patterns in accordance with the comparison.

7. In a printed circuit board testing apparatus for testing conductivity of the circuit patterns formed on a printed circuit board, a device for detecting the misalignment between the circuit patterns and probes carried by a jig of the testing apparatus, comprising;

a first pair of electrodes fixedly carried by the jig and arranged such that, when the circuit patterns and probes are at their expected relative inspection positions, the electrodes face a selected wiring of the circuit patterns with a gap to form capacitive couplings with the wiring faced thereby, with the electrodes shifting sideways and lengthwise of the wiring from each other and being point symmetrical with each other with respect to a point on the center line of the wiring, whereby the electrodes cover the same amount of area of the wiring respectively;

a test signal supplier for supplying a test signal to the selected wiring, the test signal having a nature changing its electric parameter to be transmitted through the capacitive coupling;

a first comparator for comparing the test signals received by the electrodes through the capacitive coupling, the test signals being a function of the areas of the selected circuit pattern faced by the electrodes; and misalignment detector for determining alignment and misalignment between the circuit patterns and probes in accordance with the output of the first comparator.

8. A device for detecting the misalignment between the circuit patterns and probes according to claim 7, wherein the selected wiring has a first line and second line which are at right angle with each other, and the first pair of electrodes faces the first line, and the device further comprising a second pair of electrodes fixedly carried by the jig and arranged such that, when the circuit patterns and probes are at their expected relative inspection positions, the electrodes face the second line with a gap to form capacitive couplings with the circuit patterns faced thereby, with the electrodes shifting sideways and lengthwise of the circuit pattern from each other and being point symmetrical with each other with respect to a point on the center line of the second line and the test signals received by the electrodes through the capacitive coupling, the test signals being as a function of the areas of the selected circuit pattern faced by the electrodes, whereby the electrodes cover the same area respectively and a second comparator for comparing the outputs of the second pair of electrodes; and wherein said misalignment detector detects misalignment in two directions in accordance with the outputs of the first and second comparators.

* * * * *

UNITED STATES PATENT AND TRADEMARK OFFICE
CERTIFICATE OF CORRECTION

PATENT NO.     : 6,353,327 B2
DATED          : March 5, 2002
INVENTOR(S)    : Hideo Nishikawa It is certified that error appears in the above-identified patent and that said Letters Patent is hereby corrected as shown below:

<u>Title page,</u>
The total number of drawings should be changed to read -- 24 --

Figure 11:
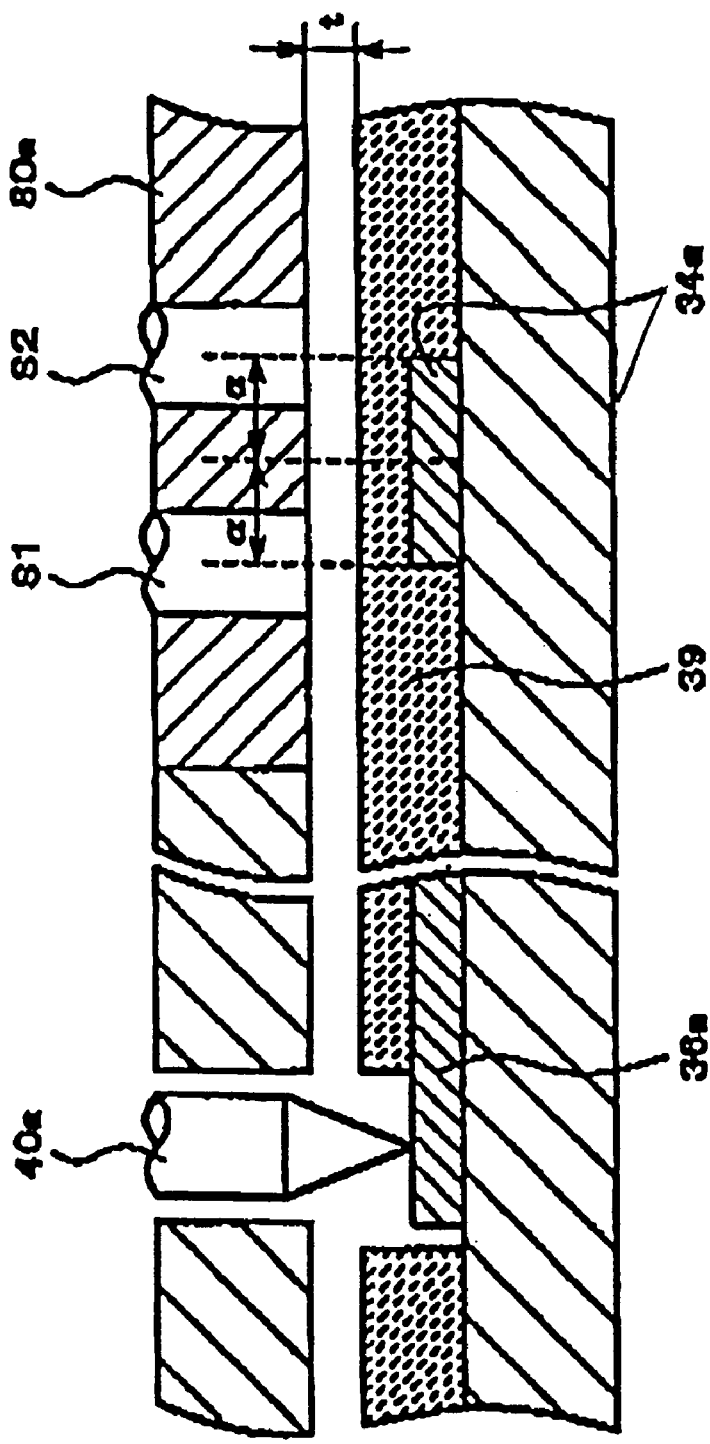
FIG. 11 illustrates the relationship between a circuit board and a misalignment sensor unit.

<u>Drawings,</u>
The attached formal drawings for Figs. 11; 13A&13B; 14; 15; 16A&B; 17A,B,C,D; 21; 22A&B and 26 should be substituted for the drawings as printed.

Signed and Sealed this

Twenty-fourth Day of December, 2002

JAMES E. ROGAN
*Director of the United States Patent and Trademark Office*